US012017341B2

(12) United States Patent
Motowaki

(10) Patent No.: US 12,017,341 B2
(45) Date of Patent: Jun. 25, 2024

(54) ROBOT APPARATUS FOR SOLDERING

(71) Applicant: FANUC CORPORATION, Yamanashi (JP)

(72) Inventor: Yoshio Motowaki, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 958 days.

(21) Appl. No.: 16/795,901

(22) Filed: Feb. 20, 2020

(65) Prior Publication Data
US 2020/0282567 A1 Sep. 10, 2020

(30) Foreign Application Priority Data
Mar. 6, 2019 (JP) .................. 2019-040966

(51) Int. Cl.
*B25J 11/00* (2006.01)
*B23K 3/06* (2006.01)
(Continued)

(52) U.S. Cl.
CPC .......... *B25J 11/005* (2013.01); *B23K 3/0607* (2013.01); *B23K 3/082* (2013.01); *B23K 3/087* (2013.01); *B23K 37/00* (2013.01); *B25J 9/0093* (2013.01); *B25J 9/0096* (2013.01); *B25J 15/04* (2013.01); *H05K 13/0465* (2013.01);
(Continued)

(58) Field of Classification Search
None
See application file for complete search history.

(56) References Cited

U.S. PATENT DOCUMENTS 2,646,620 A * 7/1953 Geddes ................ B23K 3/0669
228/183
6,039,805 A * 3/2000 Davis ..................... B23K 3/082
118/74
(Continued)

FOREIGN PATENT DOCUMENTS

CN 101885096 A 11/2010
CN 105873709 A 8/2016
(Continued)

OTHER PUBLICATIONS technopedia.com, "End Effector", https://www.techopedia.com/definition/15220/end-effector , Nov. 4, 2016 (Year: 2016).*
(Continued)

*Primary Examiner* — Erin B Saad
*Assistant Examiner* — Carlos J Gamino
(74) *Attorney, Agent, or Firm* — Buchanan Ingersoll & Rooney PC

(57) ABSTRACT

The robot apparatus includes a solder pot having a nozzle from which solder flows out, a flux ejection tool for ejecting flux, and a support tool for supporting the solder pot. The robot apparatus includes a table for supporting a workpiece, and a placement member on which the operation tools and the solder pot can be placed. The controller performs a flux application control for coupling the flux ejection tool to the robot and applying flux to the workpiece, a preheating control for coupling the support tool to the robot and arranging the solder pot below the workpiece so as to heat the workpiece, and a supply control for moving the nozzle of the solder pot closer to the workpiece and supplying the solder.

5 Claims, 32 Drawing Sheets

(51) Int. Cl.
  *B23K 3/08* (2006.01)
  *B23K 37/00* (2006.01)
  *B25J 9/00* (2006.01)
  *B25J 15/04* (2006.01)
  *H05K 13/04* (2006.01)
  *B23K 101/42* (2006.01)

(52) U.S. Cl.
  CPC .. *B23K 2101/42* (2018.08); *G05B 2219/2601* (2013.01); *G05B 2219/45029* (2013.01); *G05B 2219/50391* (2013.01)

(56) References Cited

U.S. PATENT DOCUMENTS

| | | | |
|---|---|---|---|
| 9,883,597 | B2 | 1/2018 | Senga et al. |
| 2003/0111517 | A1* | 6/2003 | Takaguchi ............ H05K 3/3468 228/180.1 |
| 2009/0308912 | A1* | 12/2009 | Diehm ................... B23K 3/082 228/33 |
| 2016/0059170 | A1* | 3/2016 | Yamakawa ............ B23K 3/082 55/385.5 |
| 2017/0209949 | A1* | 7/2017 | Colijn ................ H05K 13/0061 |
| 2018/0093340 | A1 | 4/2018 | Kressmann |
| 2022/0016724 | A1* | 1/2022 | Colijn ....................... B23K 1/08 |
| 2022/0184726 | A1* | 6/2022 | Proppert ............. H05K 3/3468 |

FOREIGN PATENT DOCUMENTS

| | | | | |
|---|---|---|---|---|
| CN | 205600088 | U | | 9/2016 |
| CN | 106312226 | A | | 1/2017 |
| DE | 102016121160 | A1 | * | 5/2018 .......... B23K 3/0653 |
| JP | 60054270 | A | | 3/1985 |
| JP | 01143763 | A | | 6/1989 |
| JP | 08064941 | A | * | 3/1996 |
| JP | 08064941 | A | | 3/1996 |
| JP | 2761204 | B | | 6/1998 |
| JP | 10156527 | A | * | 6/1998 |
| JP | 10156527 | A | | 6/1998 |
| JP | 11245027 | A | | 9/1999 |
| JP | 11298134 | A | | 10/1999 |
| JP | 2002144075 | A | | 5/2002 |
| JP | 2005167142 | A | | 6/2005 |
| JP | 2007260706 | A | | 10/2007 |
| JP | 2007335715 | A | | 12/2007 |
| JP | 4414642 | B | | 2/2010 |
| JP | 2012035391 | A | * | 2/2012 |

OTHER PUBLICATIONS crossco.com, "https://www.crossco.com/resources/technical/advantages-of-gantry-system-vs-6-axis-robot-solution/", Nov. 14, 2016.*
ATI Industrial Automation, "Why ATI Tool Changers?", https://www.youtube.com/watch?v=kDP-oofDn4w , Feb. 5, 2016 (Year: 2016).*

* cited by examiner

ROBOT APPARATUS FOR SOLDERING

CROSS-REFERENCE TO RELATED APPLICATIONS

This application is a new U.S. Patent Application that claims benefit of Japanese Patent Application No. 2019-040966, dated Mar. 6, 2019, the disclosure of this application is being incorporated herein by reference in its entirety for all purposes.

BACKGROUND OF THE INVENTION

1. Field of the Invention

The present invention relates to a robot apparatus that performs soldering.

2. Description of the Related Art

The processes for manufacturing products include a process for securing parts by soldering. For example, electronic components are secured to a printed board by soldering, and are connected to an electric circuit formed on the printed board. In the prior arts, a spot soldering device that solders small areas of a workpiece one by one is known (for example, Japanese Unexamined Patent Publication No. 2005-167142A). In the spot soldering device, a table that moves in the X-axis direction and the Y-axis direction is disposed, and the relative position of the solder pot with respect to the workpiece is changed so that a desired portion can be soldered.

In order to perform soldering, flux is applied to a portion to be soldered so as to remove oxides and improve wettability. Further, preheating for heating the board is performed. Thereafter, molten solder is supplied to a portion to be soldered in order to perform soldering.

In the prior arts, a soldering device that performs a process of supplying solder to a board as well as a process of applying flux and a process of preheating for heating the board (for example, Japanese Patent No. 2761204B, Japanese Unexamined Patent Publication No. 11-298134A, and Japanese Patent No. 4414642B).

SUMMARY OF THE INVENTION

In spot soldering devices commercially available, a flux applying process, a board preheating process, and a solder supplying process are performed by different devices. Thus, in order to perform each process, it is necessary to convey a board between the devices. However, components that are not soldered may fall over or tilt with respect to the board while the workpiece is being conveyed. Further, in order to shift one process to another process, there is the problem that a complicated device for conveying the board is necessary.

Further, in the conventional spot soldering devices capable of performing the flux applying process, the preheating process, and the solder supplying process, devices for performing respective processes are arranged on the lower side. Further, the board moves above each device. In such a structure, there is the problem that the size of the soldering device tends to be increased, since the devices for performing the respective processes are formed separately. Thus, in order to arrange the soldering device, it is necessary to secure a large space.

A robot apparatus according to a first aspect of this disclosure includes a robot having a plurality of joints and operation tools each of which is connected to the robot. The robot apparatus includes a solder pot having a container for melting and storing solder and a nozzle from which the solder is flowed out. The robot apparatus includes a table that is disposed above the robot and supports a workpiece, and a placement member on which the operation tools and the solder pot can be placed. The robot apparatus includes a controller for controlling the robot. The operation tools include a flux ejection tool that ejects soldering flux, and a support tool that supports the solder pot. The robot has a function of automatically replacing operation tools. The operation tools and the solder pot are placed on the placement member. The controller performs a flux application control for coupling the flux ejection tool to the robot and applying flux to a portion to be soldered of the workpiece. The controller performs a preheating control for coupling the support tool to the robot and arranging the solder pot below the workpiece so as to heat the workpiece by the heat released from the solder pot. The controller performs a supply control for moving the nozzle of the solder pot closer to the workpiece so as to supply solder to a portion of the workpiece to be soldered.

A robot apparatus according to a second aspect of this disclosure includes a robot having a plurality of joints and operation tools each of which is connected to the robot. The robot apparatus includes a solder pot having a container for melting and storing solder and a nozzle from which the solder flows out. The robot apparatus includes a table that is disposed above the robot and supports a workpiece, and a placement member on which the operation tools and the solder pot can be placed. The robot apparatus includes a controller that controls the robot. The operation tools includes a flux ejection tool that ejects soldering flux, a preheating tool having a heater the temperature of which can be increased, and a support tool that supports the solder pot. The robot has a function of automatically replacing operation tools. The operation tools and the solder pot are placed on the placement member. The controller performs a flux application control for coupling the flux ejection tool to the robot and applying the flux to a portion to be soldered of the workpiece. The controller performs a preheating control for coupling the preheating tool to the robot and moving the preheating tool closer to the workpiece so as to heat the workpiece. The controller performs a supply control for coupling the support tool to the robot and moving the nozzle of the solder pot closer to the workpiece so as to supply solder to a portion of the workpiece to be soldered.

DETAILED DESCRIPTION

A robot apparatus according to an embodiment will be described with reference to FIGS. 1 to 32. The robot apparatus of the present embodiment performs a soldering operation in order to secure an electronic component to a printed board as a workpiece. The robot apparatus of the present embodiment performs an operation of applying flux, an operation of heating the printed board, and an operation of supplying solder by changing an operation tool so as to secure a component to the printed board.

Figure 1:
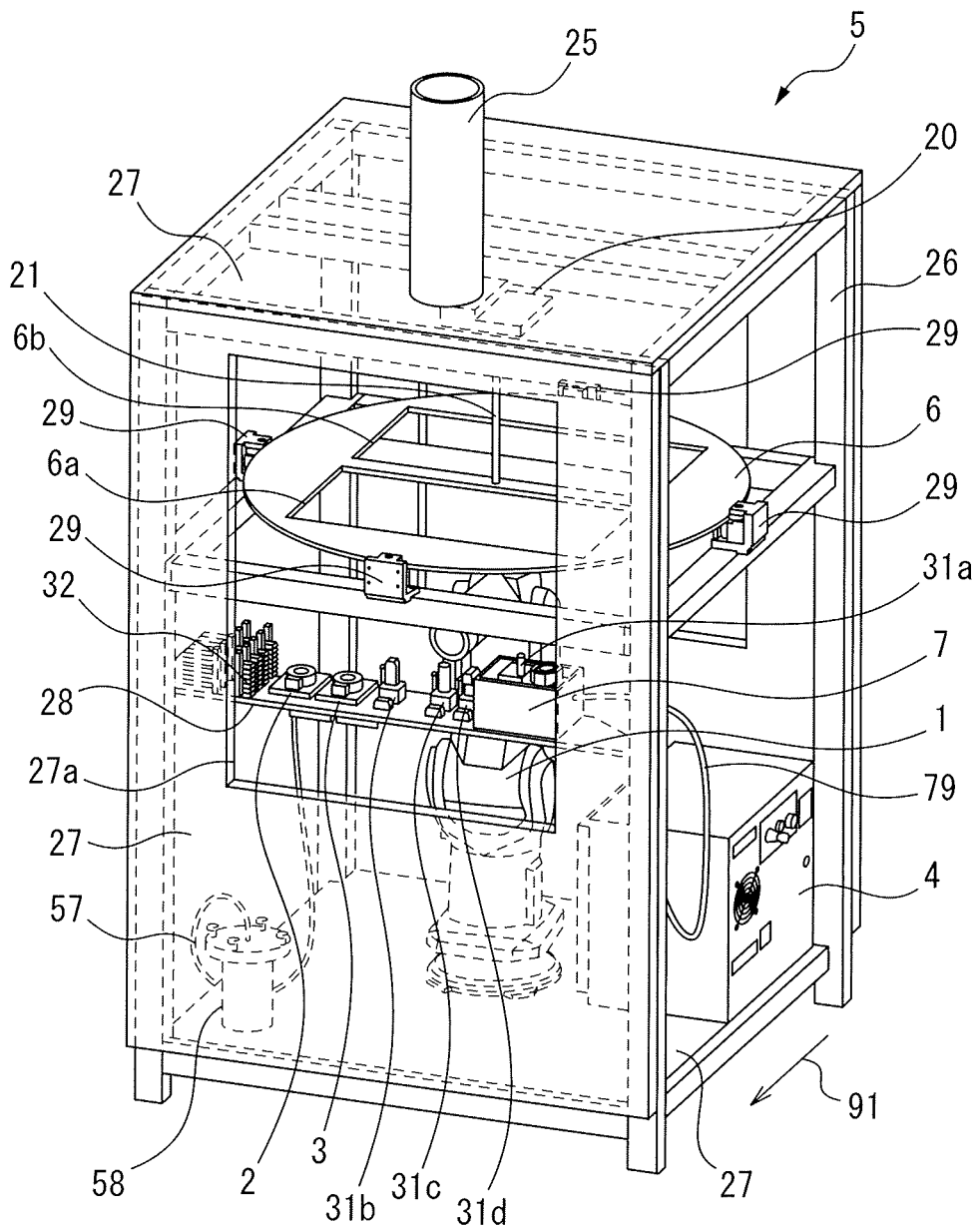
FIG. 1 is a perspective view of a robot apparatus according to an embodiment.

FIG. 1 is a perspective view of the robot apparatus according to the present embodiment. The robot apparatus 5 of the present embodiment is a spot soldering device that performs soldering in a predetermined partial area of a workpiece. The robot apparatus 5 includes an operation tool as an end effector and a robot 1 that moves the operation tool. The robot apparatus 5 includes a solder pot 7 having a nozzle 31a from which the solder is flowed out toward the workpiece. The operation tools of the present embodiment include a flux ejection tool 2 for applying flux to a printed board and a support tool 3 for supporting the solder pot 7 for supplying solder to the printed board. The flux ejection tool 2 has a function of ejecting soldering flux.

Figure 2:
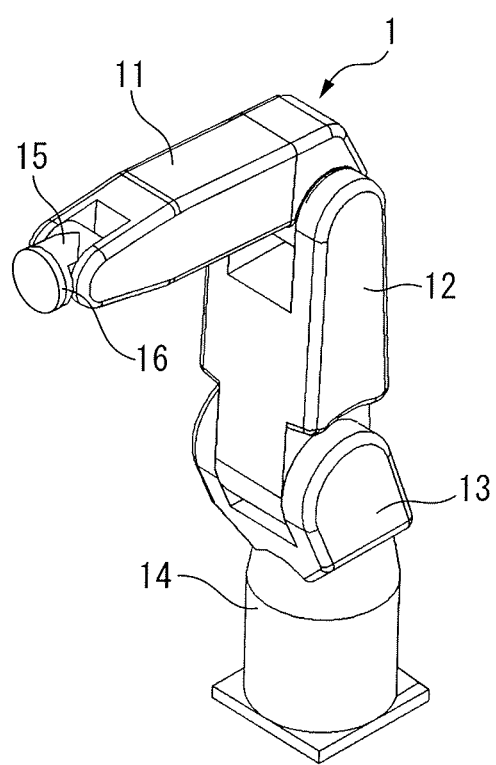
FIG. 2 is a perspective view of a robot according to the embodiment.

FIG. 2 is a perspective view of a robot of the present embodiment. The robot 1 of the present embodiment is an articulated robot including a plurality of joints. The robot 1 includes a base 14 and a turning base 13 supported by the base 14. The base 14 is secured to a frame body 26 via a panel 27. The turning base 13 is formed so as to rotate with respect to the base 14. The robot 1 includes an upper arm 11 and a lower arm 12. The lower arm 12 is rotatably supported by the turning base 13 via a joint. The upper arm 11 is rotatably supported by the lower arm 12 via a joint. Further, the upper arm 11 rotates around a rotation axis parallel to the extending direction of the upper arm 11.

The robot 1 includes a wrist 15 coupled to an end of the upper arm 11. The wrist 15 is rotatably supported by the upper arm 11 via a joint. The wrist 15 includes a flange 16 that is rotatably formed. The operation tool is secured to the flange 16. The robot 1 of the present embodiment has six drive axes, but is not limited to this configuration. Any robot that can change the position and the orientation of the operation tool can be adopted.

Referring to FIG. 1, the robot apparatus 5 includes the frame body 26 that supports the devices and components constituting the robot apparatus 5, and a placement member 28 supported by the frame body 26. The panel 27 is disposed around the frame body 26. The placement member 28 is disposed on the side of the robot 1. The placement member 28 is formed so that the flux ejection tool 2, the support tool 3, and the solder pot 7 can be placed thereon.

In the present embodiment, the side indicated by arrow 91, on which the placement member 28 is disposed, is referred to as the front side of the robot apparatus 5. The placement member 28 is disposed at the front side of the robot 1. The placement member 28 is disposed within a range in which the robot 1 can operate the components placed on the placement member 28. For example, the placement member 28 is disposed at a position where the robot 1 can replace the operation tool placed on the placement member 28.

The robot apparatus 5 includes a robot controller 4 as a controller for controlling the robot 1. The robot controller 4 controls the flux ejection tool 2 and the support tool 3. Further, the robot controller 4 controls a table drive motor 20 for driving a table 6.

The robot apparatus 5 includes a flux supply device 58 for supplying pressurized flux to the flux ejection tool 2. The flux supply device 58 has a tank for storing flux and a pump for pressurizing the flux. The flux supply device 58 is controlled by the robot controller 4. The flux pressurized in the flux supply device 58 is supplied to the flux ejection tool 2 through a flux supply tube 57. The flux supply device 58 is placed on the panel 27 disposed at the bottom of the frame body 26.

The solder pot 7 is connected to the robot controller 4 via a cable 79. The solder pot 7 is powered via the cable 79. The solder pot 7 has a function of melting and storing the solder and discharging the solder from the nozzle 31a.

Figure 3:
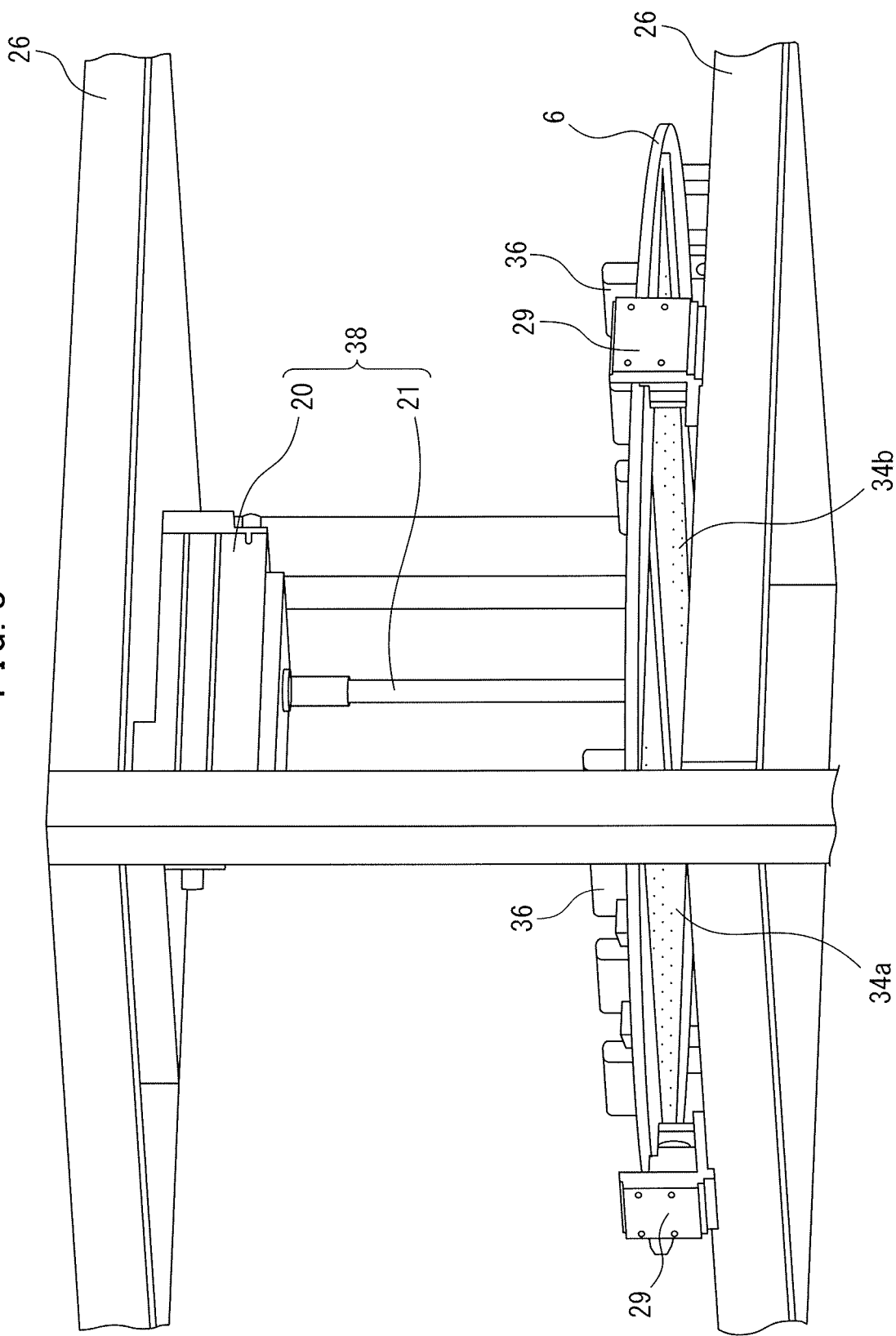
FIG. 3 is a perspective view of a table and a table drive motor according to the embodiment.

FIG. 3 is an enlarged perspective view of the table and the table drive motor for driving the table according to the present embodiment. Referring to FIGS. 1 and 3, the robot apparatus 5 has the table 6 disposed above the robot 1. The table 6 of the present embodiment is formed so as to have a circular planar shape. The table 6 supports printed boards 34a and 34b as workpieces. The table 6 has openings 6a and 6b in which the printed boards 34a and 34b are disposed. In the present embodiment, pallets 33 on which a plurality of printed boards 34a and 34b are placed are disposed in the openings 6a and 6b. It should be noted that the table may be formed so that the workpieces are placed directly thereon without using the pallets.

The robot apparatus 5 includes a table drive device 38 for driving the table 6. The table drive device 38 includes a table drive motor 20 for rotating the table 6. The rotational force output by the table drive motor 20 is transmitted to the table 6 via a shaft 21. The shaft 21 is connected to the center of the circular planar shape of the table 6. The table drive motor 20 is driven so as to rotate the table 6 in the circumferential direction. It should be noted that the table drive device may be formed so as to rotate the table with air pressure.

Figure 4:
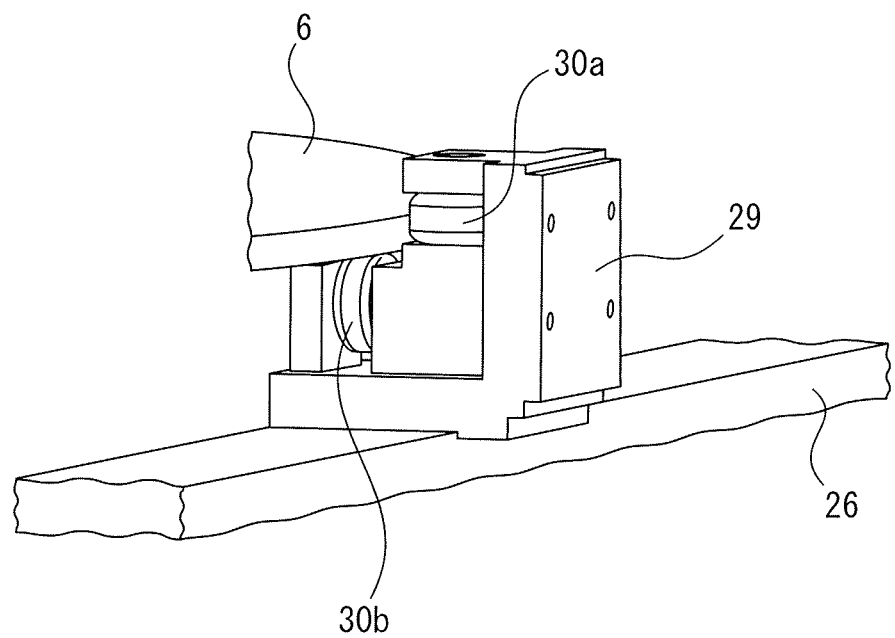
FIG. 4 is an enlarged perspective view of a support member that supports the table according to the embodiment.

FIG. 4 is an enlarged perspective view of a support member according to the present embodiment. Referring to FIGS. 1, 3 and 4, the table 6 is supported by a support member 29. The support member 29 is secured to the frame body 26. The support member 29 includes a roller 30a that supports the outer peripheral surface of the table 6 and a roller 30b that supports the bottom surface of the table 6. The roller 30a restricts the movement of the table 6 in the radial direction. The roller 30b restricts the movement of the table 6 in the vertical direction. Moreover, the roller 30b suppresses bending of the table 6.

Referring to FIG. 1, a plurality of support members 29 are arranged in the robot apparatus 5. In the present embodiment, the support members 29 are arranged at four locations. Thus, it is possible to suppress the table 6 from moving in the radial direction or from bending by supporting the table 6 with the plurality of support members 29. As a result, the position of the printed board supported by the table 6 can be prevented from deviating from a predetermined position. In the present embodiment, four support members are arranged, but the embodiment is not limited to this. Any number of support members can be arranged in order to support the table.

Figure 5:
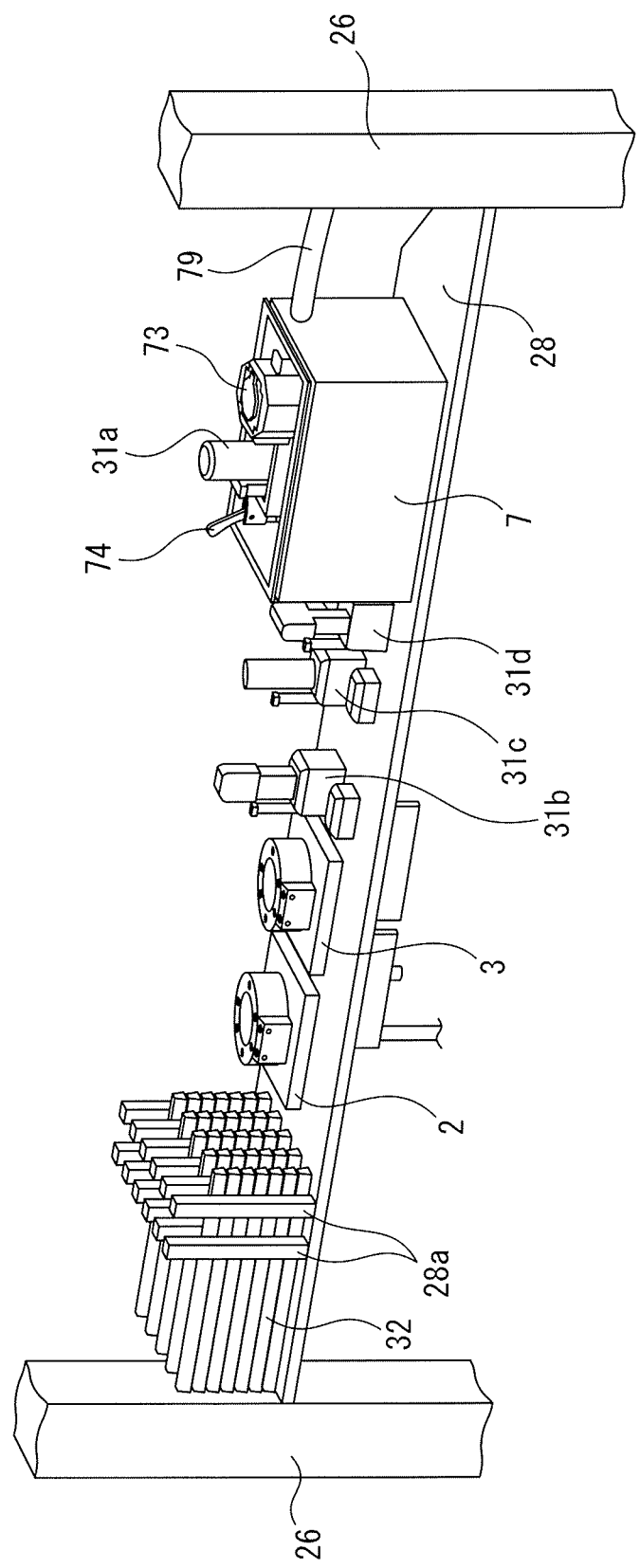
FIG. 5 is a perspective view of a placement member and components placed on the placement member according to the embodiment.

FIG. 5 is an enlarged perspective view of the placement member according to the present embodiment. The placement member 28 of the present embodiment is formed into a plate shape. The placement member 28 is secured to the frame body 26. Referring to FIGS. 1 and 5, the placement member 28 is formed so as to extend in the horizontal direction. The solder bar 32, the flux ejection tool 2, the support tool 3, and the solder pot 7 are placed on the placement member 28 of the present embodiment. Further, nozzles 31b, 31c and 31d with which the nozzle 31a of the solder pot 7 can be replaced are placed on the placement member 28.

The placement member 28 has support pillars 28a. Solder bars 32 for replenishing the solder pot 7 with solder are placed between a plurality of the support pillars 28a. The solder bars 32 are arranged between the support pillars 28a. The placement member 28 of the present embodiment is formed into a plate shape, but is not limited to this configuration. Any shape can be applied to the placement member if components such as an operation tool and a solder pot can be placed thereon.

The positions of the devices and members placed on the placement member 28 are predetermined. The robot 1 is driven to the position and posture set in an operation program 41 so as to operate the device and the member placed on the placement member 28.

Referring to FIG. 1, plate-like panels 27 are disposed around the frame body 26. An opening 27a through which an operator can check the internal state is formed in the panel 27 disposed on the front side of the frame body 26. An exhaust cylinder 25 is connected to the panel 27 disposed on the upper portion of the frame body 26. The exhaust cylinder 25 has a function of releasing, for example, vapor generated from the solder within the frame body 26 to the outside. It should be noted that the exhaust cylinder 25 may be connected to a duct for discharging the vapor to the outside of the building.

The devices and members, which constitute the robot apparatus 5 of the present embodiment, are disposed inside the frame body 26. For example, the robot 1, the placement member 28, the table 6, the table drive motor 20, the flux supply device 58, and the robot controller 4 are arranged inside the frame body 26.

In FIG. 2 and the subsequent figures, the panels 27 secured to the side portion and the upper portion of the frame body 26 are omitted. The panels 27 do not necessarily have to be arranged. Moreover, the panels 27 may be arranged on the side part, the upper part, and the lower part of the frame so as to seal the space inside the frame 26.

Figure 6:
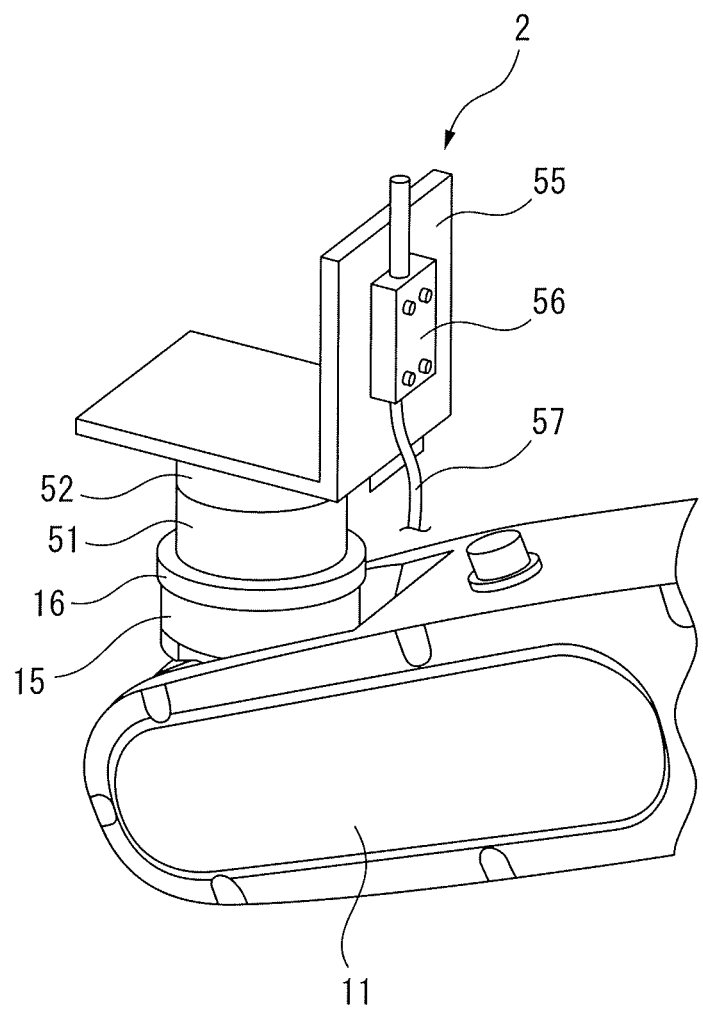
FIG. 6 is a perspective view of a flux ejection tool according to the embodiment.

FIG. 6 is an enlarged perspective view of the flux ejection tool in the present embodiment. FIG. 6 shows that the flux ejection tool 2 is coupled to the flange 16 of the wrist 15 of the robot 1. The robot apparatus 5 in the present embodiment has an automatic tool changer (ATC) that can automatically replace operation tools with one another. The automatic tool changer includes a robot-side plate 51 attached to the flange 16 of the robot 1 and a tool-side plate 52 attached to the operation tool.

The tool-side plate 52 is formed so as to be coupled to or released from the robot-side plate 51. The automatic tool changer of the present embodiment is controlled by the robot controller 4. The robot 1 changes its position and posture so as to couple the robot-side plate 51 to the tool-side plate 52 and support the operation tool. Thus, the robot 1 of the present embodiment has a function of automatically replacing operation tools including the flux ejection tool 2 and the support tool 3.

The flux ejection tool 2 includes a base member 55 secured to the tool-side plate 52. The base member 55 is formed into a plate shape. The flux ejection tool 2 has a nozzle 56 secured to the base member 55. The nozzle 56 of the present embodiment is a spray nozzle. A flux supply tube 57 for supplying flux is connected to the nozzle 56. A valve is disposed on the nozzle 56. The valve is opened so as to eject the flux from the tip of the nozzle 56. The nozzle 56 of the present embodiment is controlled by the robot controller 4.

Figure 7:
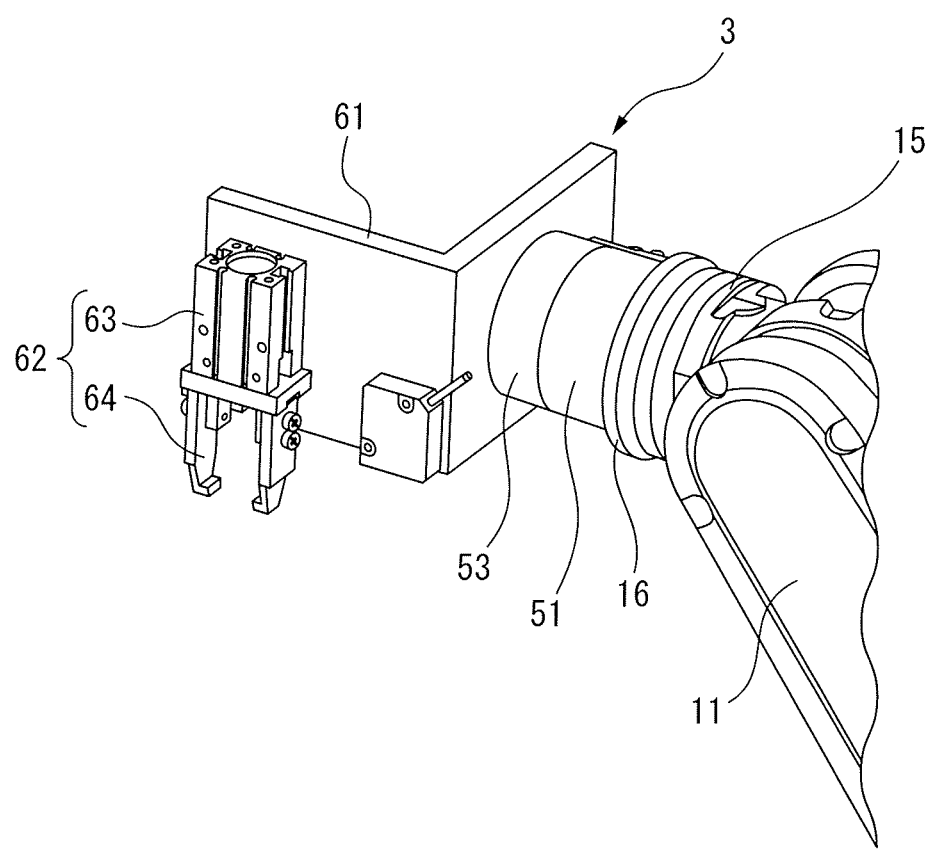
FIG. 7 is a perspective view of a support tool for supporting the solder pot according to the embodiment.

FIG. 7 is an enlarged perspective view of the support tool according to the present embodiment. The support tool 3 of the present embodiment includes a base member 61 that supports the solder pot 7 and a chuck part 62 attached to the base member 61. The base member 61 is formed into an L shape when viewed from the side. A tool-side plate 53 of the automatic tool changer is secured to the base member 61 of the support tool 3. Thus, the robot 1 can automatically couple and release the support tool 3.

The chuck part 62 has two claws 64 that face each other. Further, the chuck part 62 has a cylinder 63 for opening and closing the claws 64. The cylinder 63 is driven and thereby causes the claws 64 facing each other to move so as to grasp or release any component.

Figure 8:
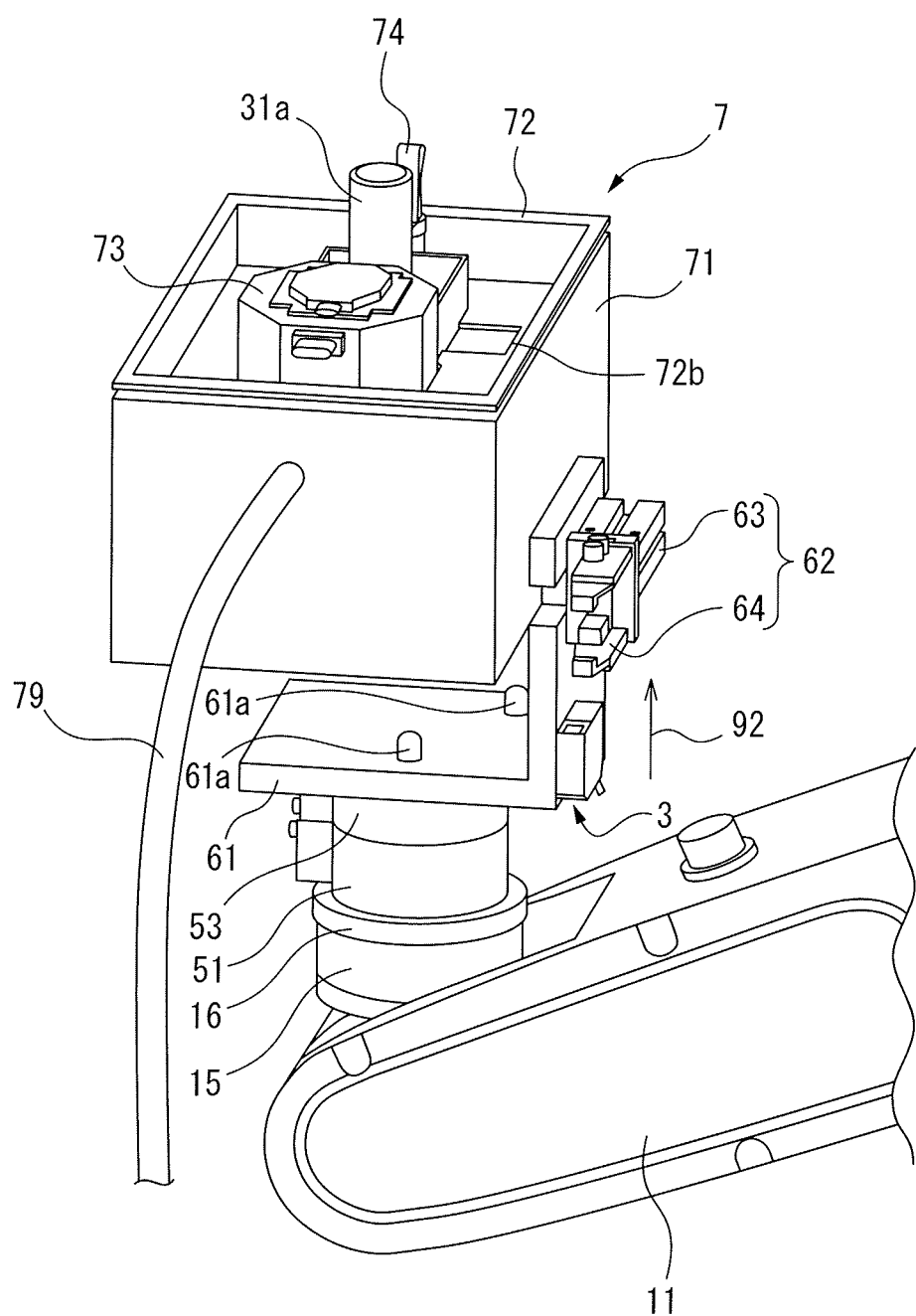
FIG. 8 is a perspective view of the solder pot before being supported by the support tool.

FIG. 8 is an enlarged perspective view of the support tool before supporting the solder pot according to the present embodiment. When the solder pot 7 is not used, the solder pot 7 is placed on the placement member 28 (see FIG. 5). A notch is formed in the placement member 28. The support tool 3 supports the bottom of the solder pot 7 through the notch. When supporting the solder pot 7, the robot 1 raises the support tool 3 from below the solder pot 7 as indicated by arrow 92.

The base member 61 of the support tool 3 has, on its surface contacting the bottom surface of the solder pot 7, a plurality of protrusions 61a. Recesses, each of which has a shape corresponding to the shape of the protrusion 61a, are formed in the bottom surface of the container 71 of the solder pot 7. The protrusions 61a of the base member 61 are fitted into the recesses of the container 71, and thus the position of the solder pot 7 is determined with respect to the support tool 3. Further, the protrusions 61a are fitted into the recesses of the solder pot 7, and thus the solder pot 7 is prevented from moving with respect to the support tool 3.

Figure 9:
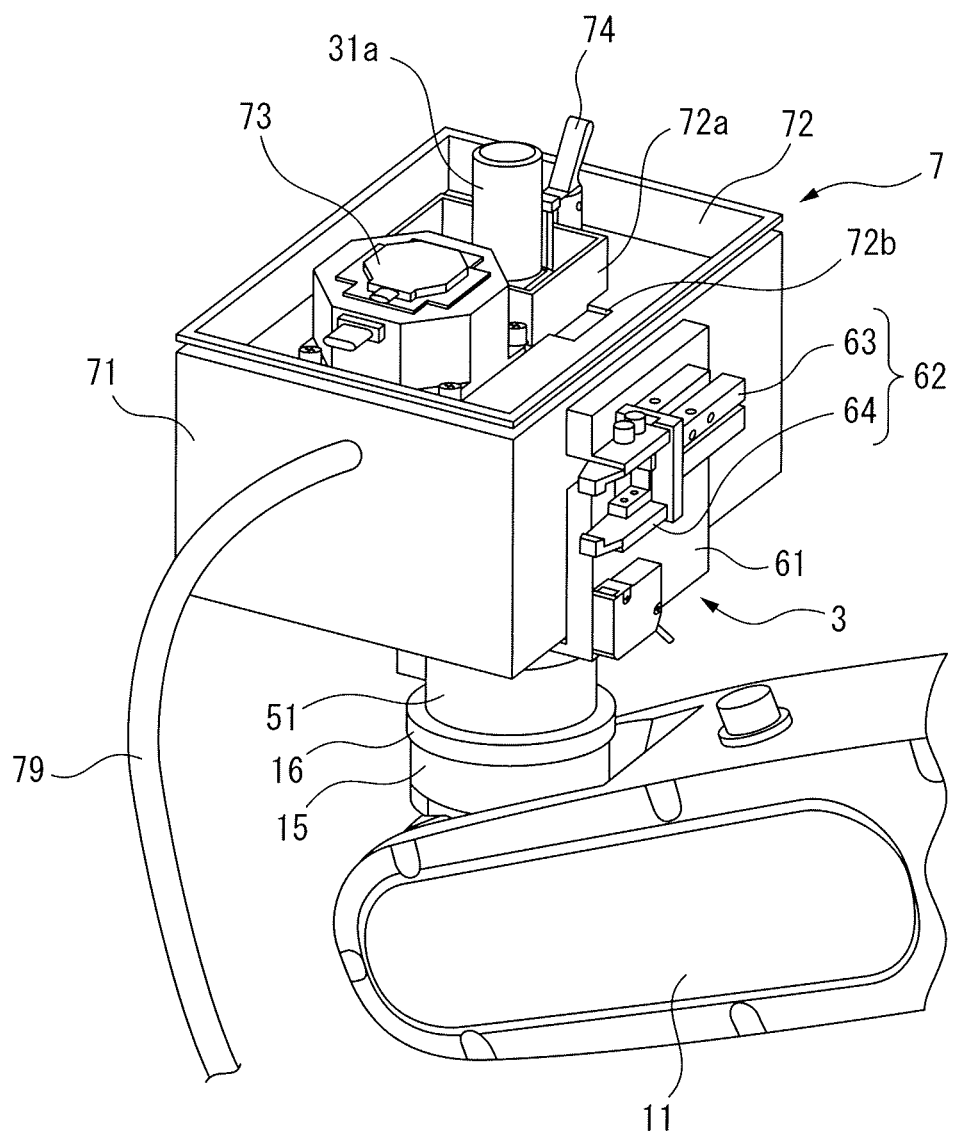
FIG. 9 is a perspective view of the solder pot after being supported by the support tool.

FIG. 9 is an enlarged perspective view of the support tool after supporting the solder pot according to the present embodiment. The base member 61 of the support tool 3 contacts the side surface and the bottom surface of the container 71 of the solder pot 7. The solder pot 7 is heavy, due to molten solder being disposed therein. Thus, the protrusions 61a formed on the base member 61 of the support tool 3 are fitted into the recesses formed in the container 71 of the solder pot 7, and thus the solder pot 7 can be reliably supported by the support tool 3.

Figure 10:
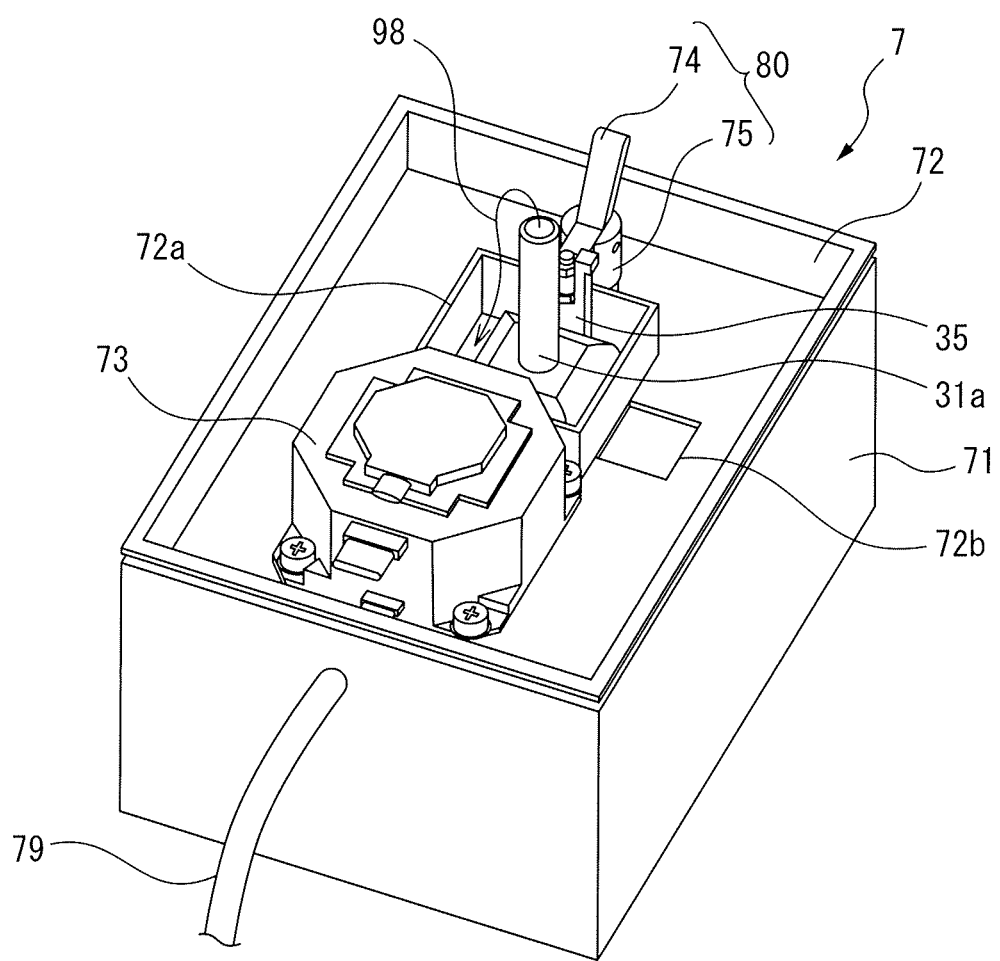
FIG. 10 is a first perspective view of the solder pot according to the embodiment.

The solder pot in the present embodiment will now be described in detail. FIG. 10 is a perspective view of the solder pot according to the present embodiment. The solder pot 7 has a container 71 that stores molten solder, and a lid member 72 that covers the upper opening of the container 71. The container 71 is formed so as to have the nozzle 31a from which the solder flows out. In the present embodiment, the nozzle 31a is disposed so that the opening of the nozzle 31a faces upward. The solder pot 7 has a motor 73 for pressurizing the solder so as to discharge the solder from the nozzle 31a.

The solder pot 7 in the present embodiment has a securing mechanism 80 that secures and releases the nozzle 31a. The securing mechanism 80 of the solder pot 7 has a turning member 74 for securing the nozzle 31a to the solder pot 7. The securing mechanism 80 includes a support member 75 for supporting the turning member 74. The nozzle 31a has an engagement part 35 that engages with the turning member 74. The turning member 74 is engaged with the engagement part 35, and thus the nozzle 31a is secured to the solder pot 7.

The solder pot 7 is formed so that a plurality of types of nozzles can be arranged thereon. For example, areas to be soldered may be small or large. Alternatively, the planar shapes of the areas to be soldered are different from one another in some cases. In such a case, spot soldering can be performed for areas having various shapes or sizes by replacing the nozzle 31a with another nozzle.

The lid member 72 of the solder pot 7 has a wall part 72a extending in the vertical direction. The wall part 72a is formed so as to surround the nozzle 31a. Further, an opening which communicates with the inner space of the solder pot 7 is formed between the wall part 72a and the nozzle 31a. A hole 72b which is shaped so that the solder bar can be inserted therein is formed in the lid member 72.

Figure 11:
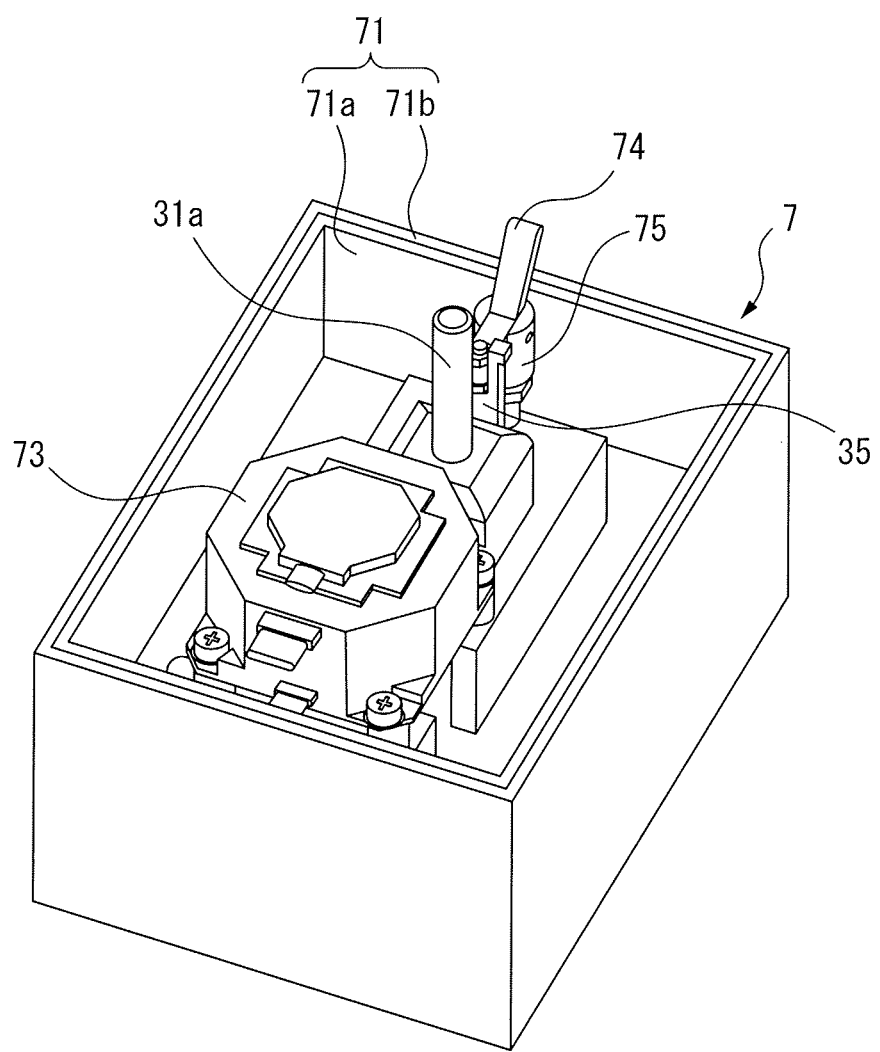
FIG. 11 is a second perspective view of the solder pot.

FIG. 11 is a perspective view of the solder pot when the lid member is removed. The container 71 according to the present embodiment has an inner member 71a made of a metal such as stainless steel, and a heat insulating member 71b formed so as to cover the inner member 71a. The heat insulating member 71b is made of a material such as ceramics or glass which is thermally resistant and has low thermal conductivity. The heat insulating member 71b is disposed so as to cover the entirety of the outer peripheral surface of the inner member 71a. Further, the lid member 72 of the present embodiment has an inner member and a heat insulating member formed so as to cover the inner member in the same way as the container 71. An electric heater as a heater is disposed on the back side of the bottom surface of the inner member 71a. The electric heater is driven and thereby melts the solder disposed inside the inner member 71a.

In the container 71 and the lid member 72 according to the present embodiment, the heat insulating member 71b is disposed so as to cover the outer surface thereof. This configuration enables the heat to be prevented from transferring from the solder pot 7. The power consumption of the electric heater for melting the solder disposed inside the solder pot 7 can be reduced.

Figure 12:
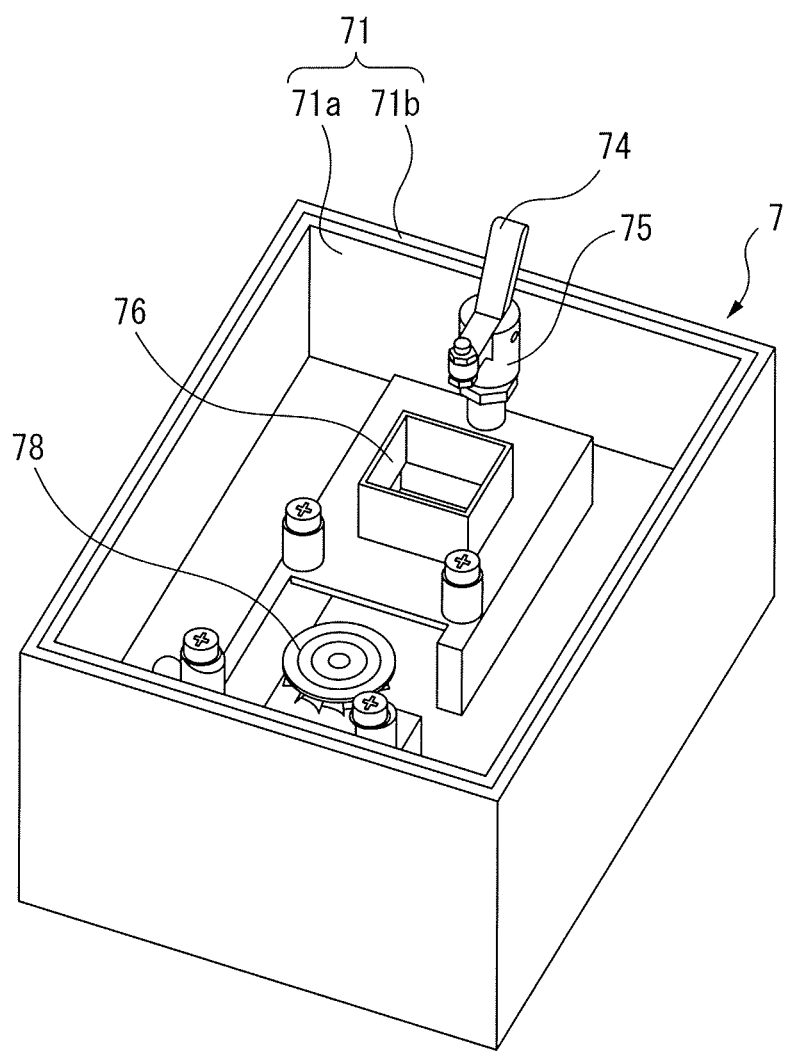
FIG. 12 is a third perspective view of the solder pot.

FIG. 12 is a perspective view of the solder pot when the motor is removed. Referring to FIGS. 11 and 12, a fitting member 76 into which the nozzle 31a is fitted is disposed inside the inner member 71a. The fitting member 76 is formed so as to be fitted with the nozzle 31a when the nozzle 31a is inserted from above. The solder pot 7 includes an impeller 78 for pressurizing the molten solder. The molten solder is supplied to the nozzle 31a through the inner space of the fitting member 76 by the impeller 78 rotated by the motor 73. Further, the molten is discharged from the tip of the nozzle 31a.

Referring to FIG. 10, excessive solder which has been discharged from the nozzle 31a flows downward through the tubular member of the nozzle 31a as indicated by arrow 98. Thereafter, the solder returns to the inside of the container 71 through the space between the nozzle 31a and the wall part 72a.

Figure 13:
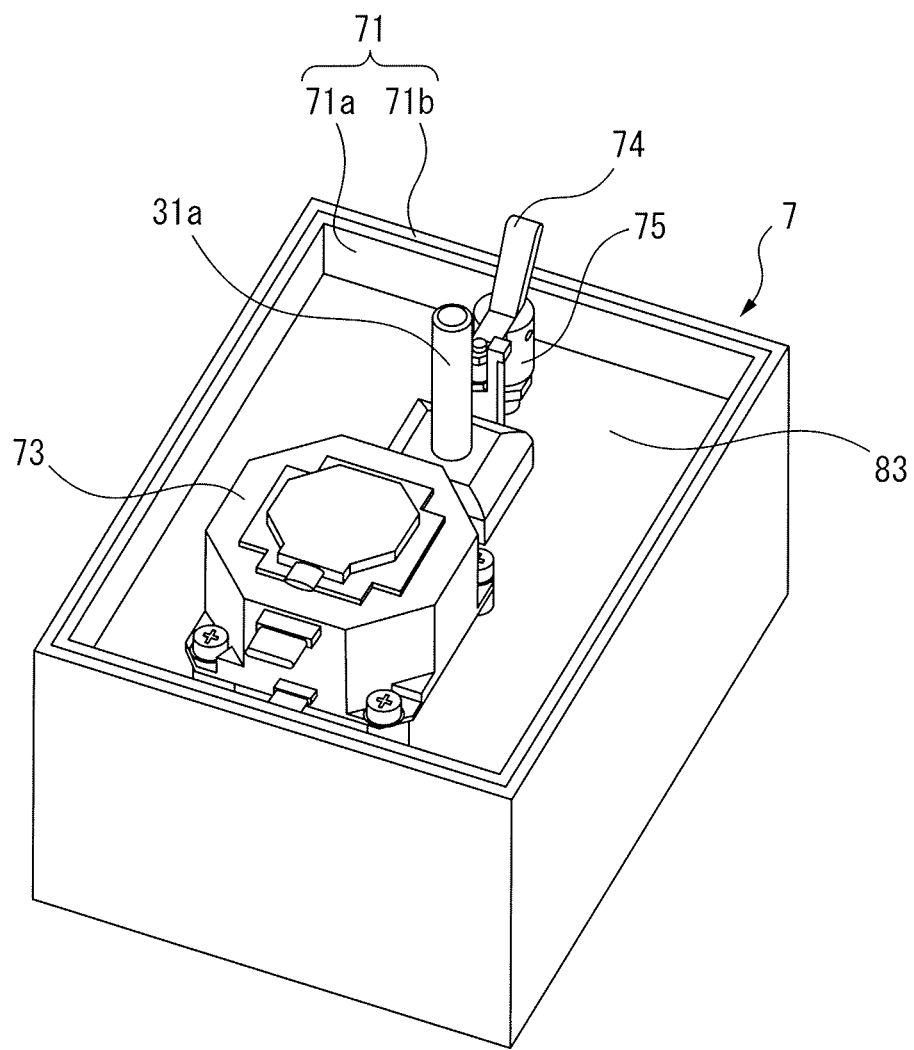
FIG. 13 is a fourth perspective view of the solder pot.

FIG. 13 is a perspective view of the solder pot which stores therein the molten solder when the lid member is removed. The molten solder 83 is stored inside the inner member 71a. Referring to FIGS. 10 and 13, the molten solder is exposed through the opening between the wall part 72a of the lid member 72 and the nozzle 31a. Hot air rises from the space between the wall part 72a and the nozzle 31a.

Figure 14:
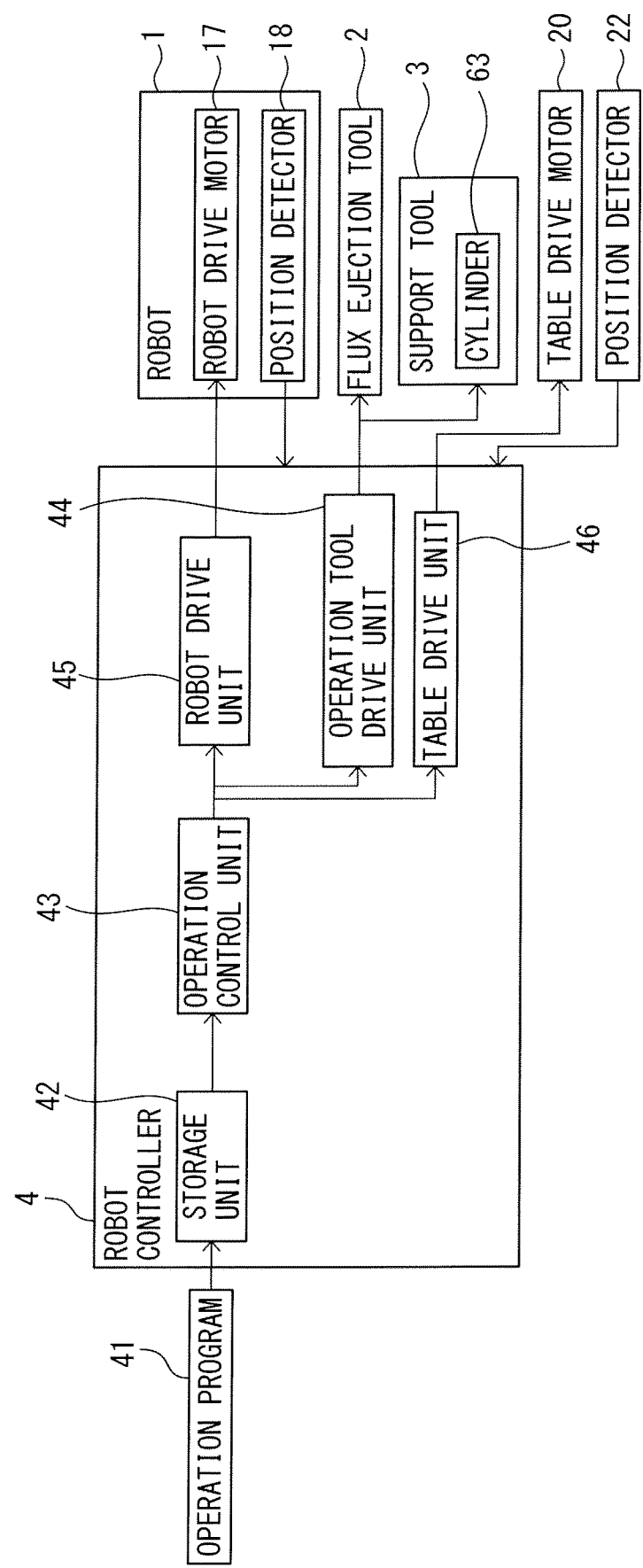
FIG. 14 is a block diagram of the robot apparatus according to the embodiment.

FIG. 14 is a block diagram of the robot apparatus according to the present embodiment. The robot 1 includes a robot drive device that changes the position and posture of the robot 1. The robot drive device includes a plurality of robot drive motors 17 that drive components such as the arm and the wrist. The robot drive motors 17 are disposed for respective components. The orientation of each component is changed by the corresponding robot drive motor 17 that is driven.

The controller of the robot apparatus 5 includes a robot controller 4. The robot controller 4 includes an arithmetic processing device (computer) having a CPU (Central Processing Unit) serving as a processor. The arithmetic processing unit includes, for example, a RAM (Random Access Memory) and a ROM (Read Only Memory), which are connected to the CPU via a bus. In order to control the robot apparatus 5, an operation program 41 which has been previously made is input to the robot controller 4. The robot controller 4 includes a storage unit 42 that stores information related to the control of the robot apparatus 5. The storage unit 42 can be configured by a storage medium capable of storing information, such as a volatile memory, a nonvolatile memory, or a hard disk. The operation program 41 is stored in the storage unit 42. The robot controller 4 of the present embodiment controls a soldering operation based on the operation program 41.

The robot controller 4 includes an operation control unit 43 that sends an operation command. The operation control unit 43 corresponds to the processor that is driven according to the operation program 41. The processor functions as the operation control unit 43, i.e., reads the operation program 41 and performs a control defined in the operation program 41.

The operation control unit 43 sends an operation command for driving the robot 1 to a robot drive unit 45 based on the operation program 41. The robot drive unit 45 includes an electric circuit that drives the robot drive motors 17. The robot drive unit 45 supplies electricity to the robot drive motors 17 based on the operation command.

Further, the operation control unit 43 sends an operation command for driving the operation tool to an operation tool drive unit 44 based on the operation program 41. The operation tool drive unit 44 includes an electric circuit that drives the operation tool. The operation tool drive unit 44 supplies electricity to the valve of the flux ejection tool 2 based on the operation command. The operation tool drive unit 44 supplies electricity to a flux supply device 58 based on the operation command. The operation tool drive unit 44 supplies electricity to drive devices including an air pump and a valve for driving the chuck part 62 based on the operation command.

The operation control unit 43 sends an operation command for driving a table to a table drive unit 46 based on the operation program 41. The table drive unit 46 includes an electric circuit for driving the table drive motor 20. The table drive unit 46 supplies electricity to the table drive motor 20 based on the operation command.

The robot 1 includes a state detector for detecting the position and posture of the robot 1. The state detectors in the present embodiment includes position detectors 18 which are attached to the robot drive motors 17 corresponding to the drive axes of the components such as an arm, etc. The robot controller 4 detects the position and posture of the robot 1 based on the output of the position detectors 18.

Further, a position detector 22 is attached to the table drive motor 20. The output of the position detector 22 is input to the robot controller 4. The rotation angle of the table 6 can be detected by the output of the position detector 22 of the table drive motor 20. The operation control unit 43 controls the table drive motor 20 so that the table 6 has a rotation angle set in the operation program 41. The rotation angle of the table drive motor 20 is controlled so that the printed board can be disposed at a desired position. Further, the robot 1 changes its position and posture based on the operation program 41, and thereby the flux can be ejected to a desired part of the printed board, the desired part of the printed board can be preheated, and the solder can be supplied to the desired part of the printed board.

Figure 15:
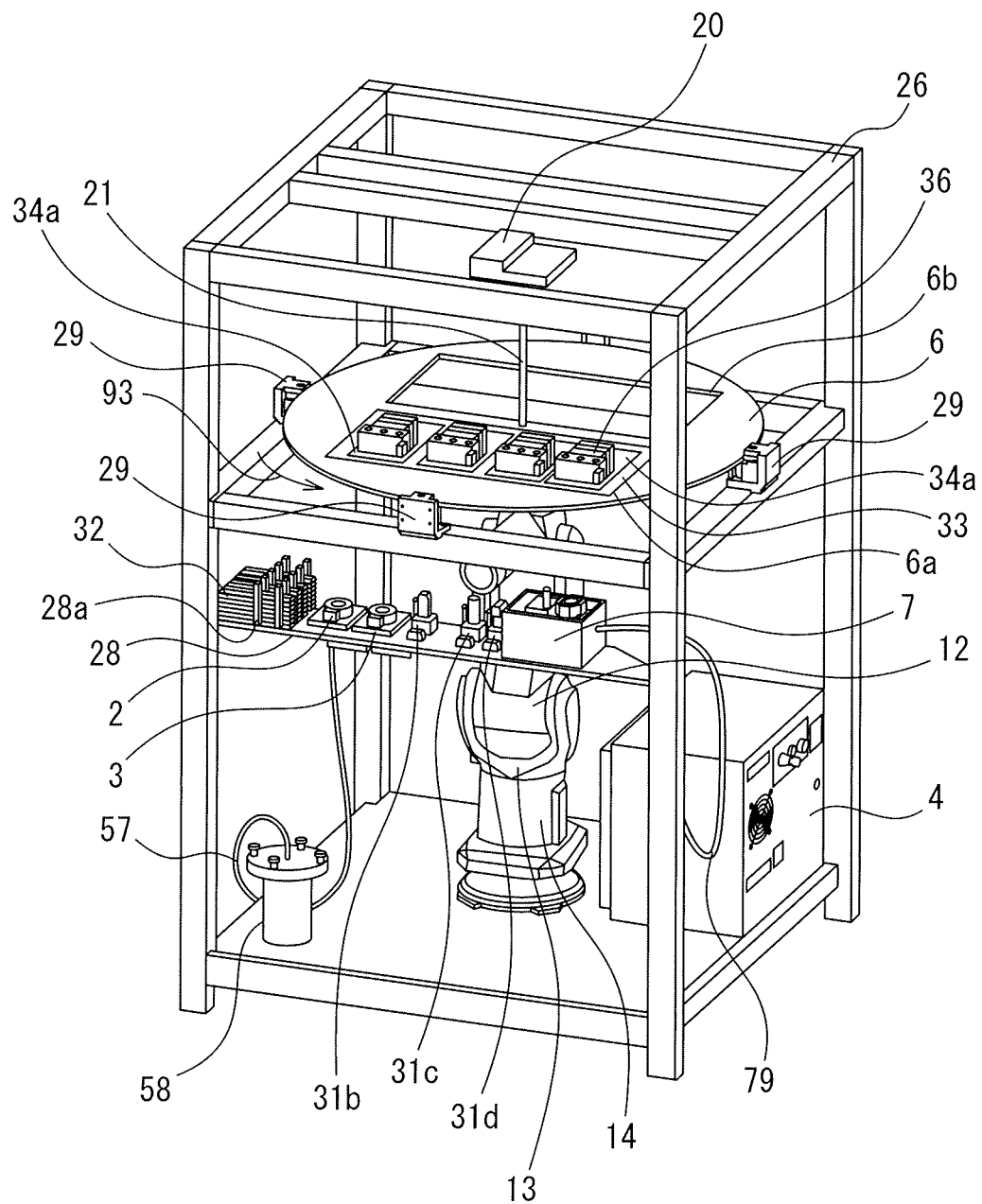
FIG. 15 is a perspective view of the robot apparatus for explaining a first process of soldering according to the embodiment.

FIG. 15 is a perspective view of the robot apparatus of the present embodiment for explaining the first process of soldering performed by the robot apparatus. The table 6 according to the present embodiment is divided into two areas. The table 6 includes a first area in which the opening 6a is formed and a second area in which the opening 6b is formed. In the example shown in FIG. 15, the first area in which the opening 6a is formed is disposed on the front side, and the second area in which the opening 6b is formed is disposed on the rear side. In the present embodiment, a soldering operation is performed for each area.

In the present embodiment, the printed board is transferred to and from the area disposed on the front side. First, a plurality of printed boards 34a are arranged in the opening 6a. Electronic components 36 that are not secured are disposed on each printed board 34a. Also in the present embodiment, the pallets 33, on which a plurality of printed boards 34a are placed, are conveyed. The pallets 33 can be conveyed by a robot for conveying pallets. Alternatively, an operator may arrange the pallets 33 in the opening 6a of the table 6. Subsequently, the robot controller 4 rotates the table 6 as indicated by arrow 93.

Figure 16:
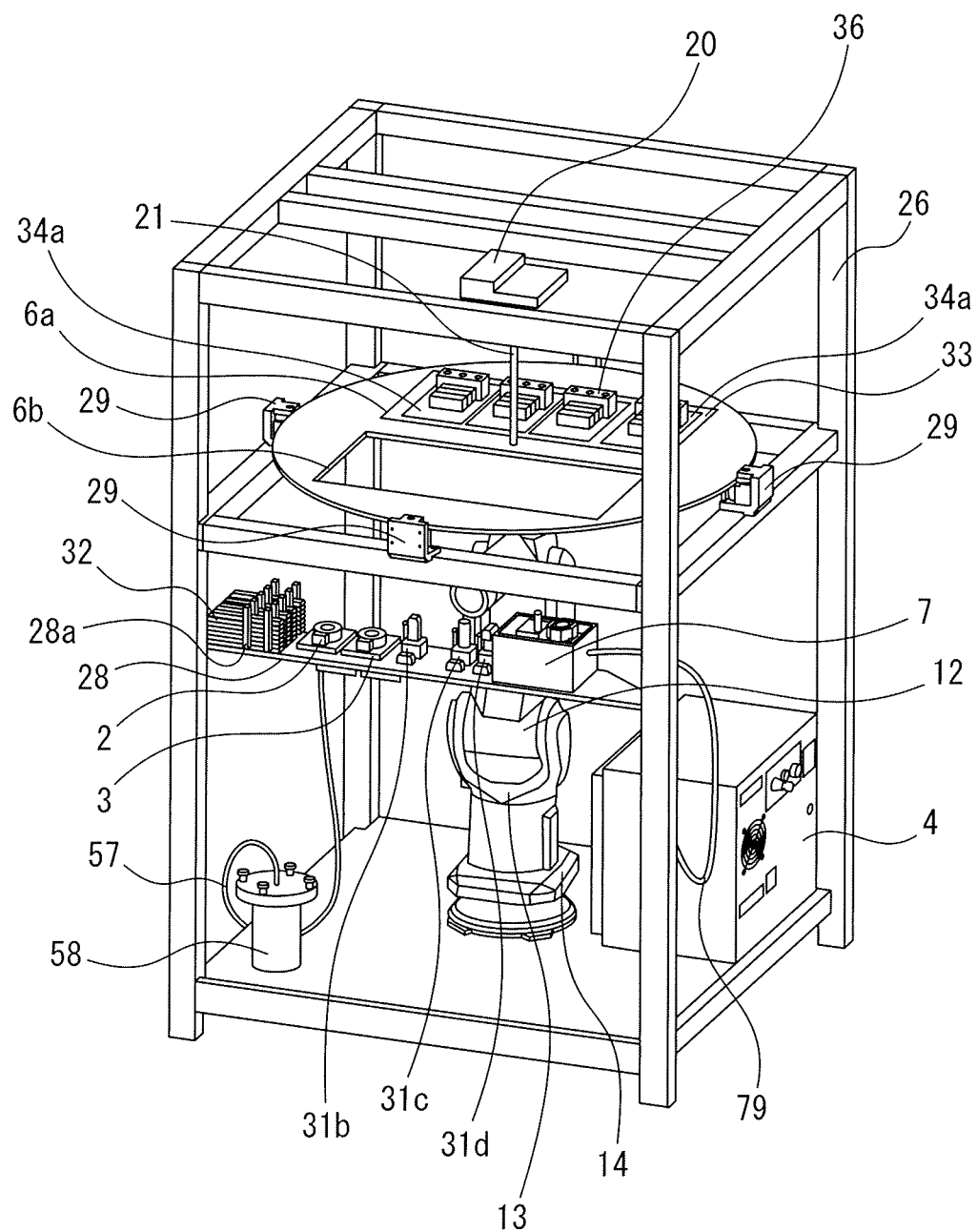
FIG. 16 is a perspective view of the robot apparatus for explaining a second process of soldering.

FIG. 16 is a perspective view of the robot apparatus for explaining the second process of soldering. The table 6 is rotated and thereby transfers the printed board 34a disposed in the opening 6a of the first area to the rear side.

Figure 17:
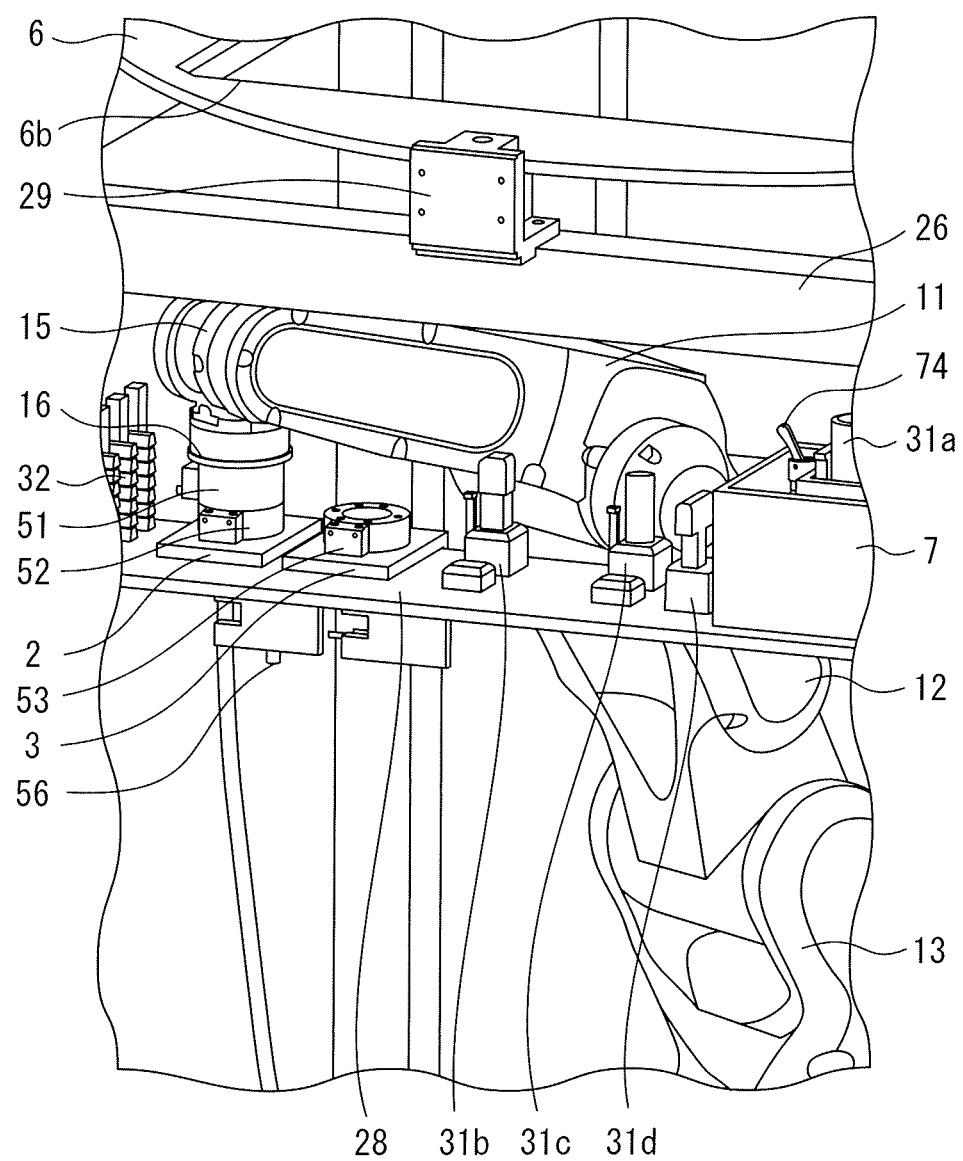
FIG. 17 is an enlarged perspective view of components placed on the placement member and the robot for explaining a third process of soldering.

FIG. 17 is an enlarged perspective view of the placement member and the robot for explaining the third process of soldering. A flux application control for applying flux to the printed board 34a placed in the first area is performed. The robot controller 4 causes the robot 1 to change its position and posture so as to couple the flux ejection tool 2 to the wrist 15 of the robot 1. The position of the flux ejection tool 2 on the placement member 28 is predetermined. Thus, the robot 1 changes its position and posture based on the operation program 41 so as to couple the flux ejection tool 2.

Figure 18:
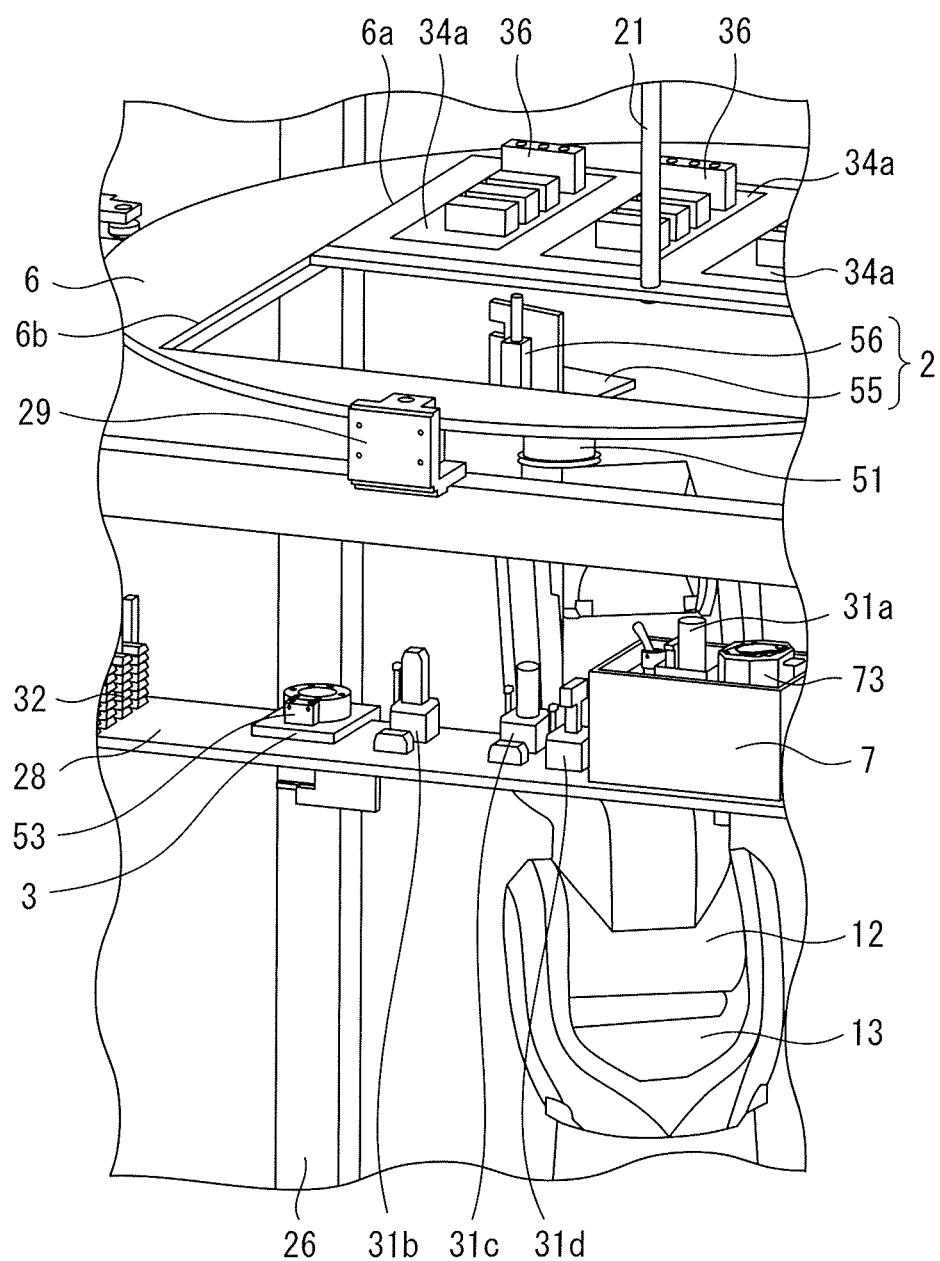
FIG. 18 is an enlarged perspective view of the robot apparatus for explaining a fourth process of soldering.

FIG. 18 is an enlarged perspective view of the robot apparatus for explaining the fourth process of soldering. The robot 1 changes its position and posture so as to arrange the flux ejection tool 2 below the printed board 34a to which the flux is applied. The table 6 is disposed so as to have a predetermined rotation angle. Thus, each printed board 34a is disposed at a predetermined position. The robot 1 changes its position and posture based on the operation program 41 and thereby the nozzle 56 of the flux ejection tool 2 is arranged so as to face a desired portion of the printed board 34a.

The robot controller 4 causes the valve of the nozzle 56 to be opened so as to eject flux therethrough. Further, the flux is applied to a portion to be soldered of each printed board 34a. In this way, the robot controller 4 causes the flux to be applied to a portion to be soldered. It should be noted that, in the flux application control, a plurality of flux ejecting operations may be performed in one printed board 34a while the position of the flux ejection tool 2 is changed.

Figure 19:
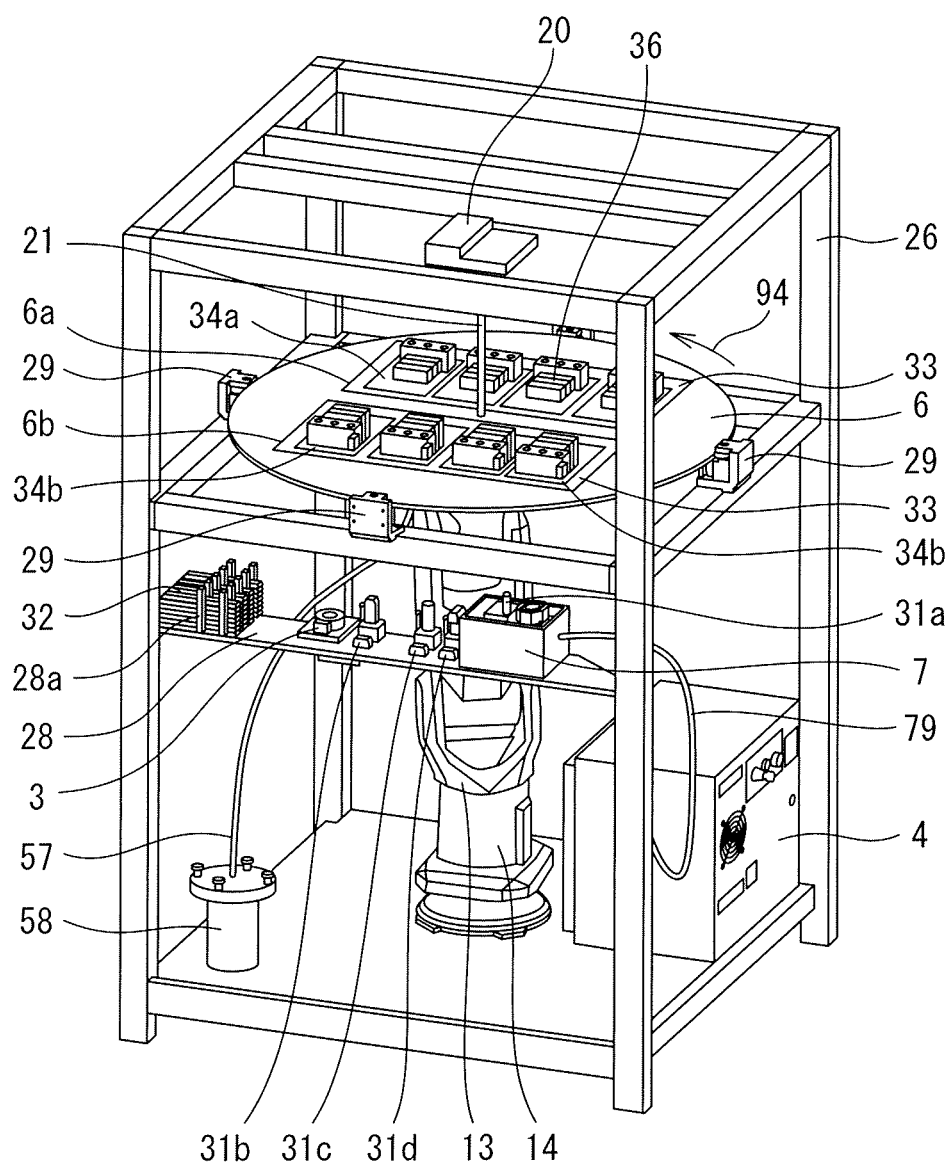
FIG. 19 is a perspective view of the robot apparatus for explaining a fifth process of soldering.

FIG. 19 is a perspective view of the robot apparatus for explaining the fifth process of soldering. While the robot 1 applies the flux to the printed board 34a disposed in the first area of the table 6, printed boards 34b, which are new workpieces, are arranged in the opening 6b in the second area. The printed boards 34b of the present embodiment are placed on the pallet 33 and conveyed.

After a control for applying flux to all the printed boards 34a disposed in the first area is completed, the robot controller 4 causes the table 6 to rotate as indicated by arrow 94. The robot controller 4 causes the printed boards 34a disposed in the first area to move to the front side. The new printed boards 34*b* disposed in the second area move to the rear side.

Figure 20:
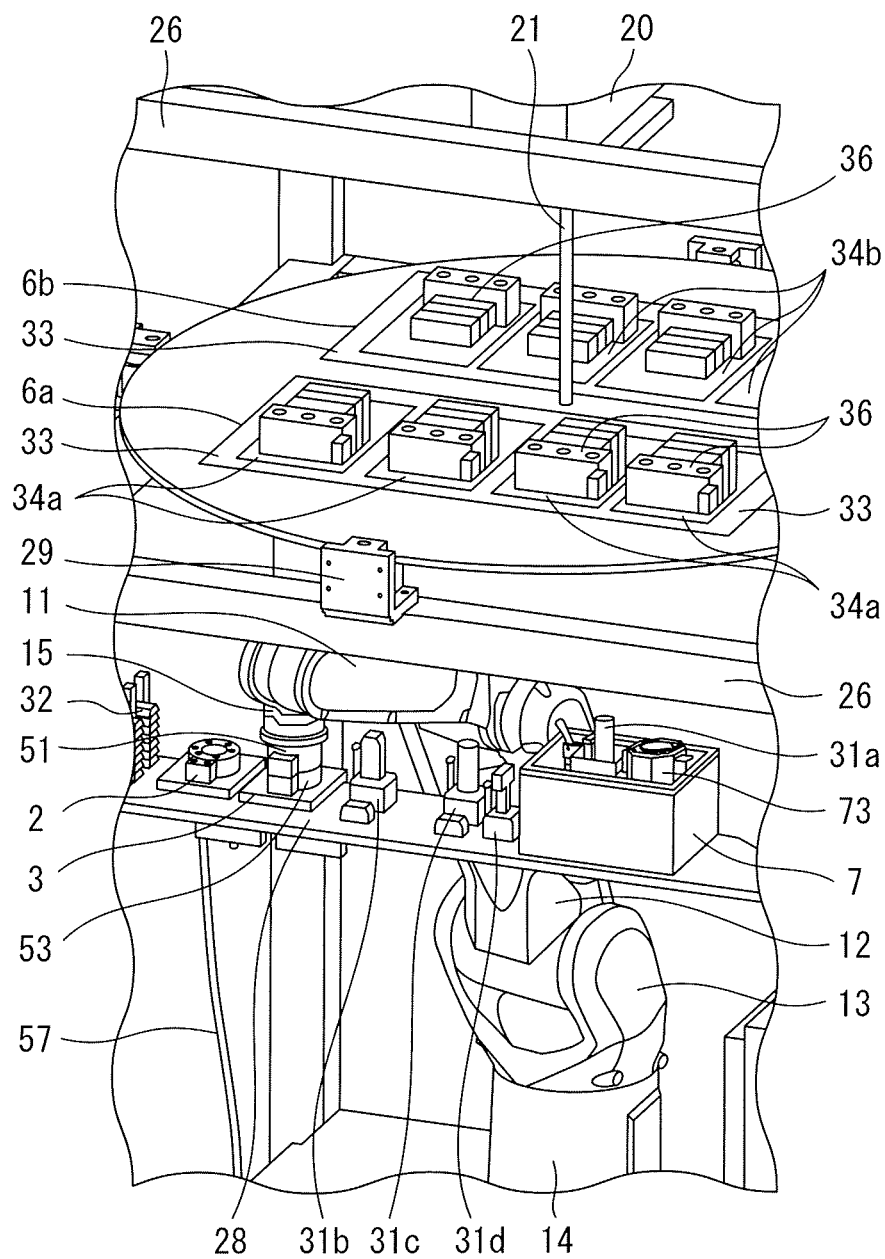
FIG. 20 is an enlarged perspective view of the robot apparatus for explaining a sixth process of soldering.

FIG. 20 is an enlarged perspective view of the robot apparatus for explaining the sixth process of soldering. The robot controller 4 controls the robot so that the operation tool connected to the wrist 15 is changed from the flux ejection tool 2 to the support tool 3. The robot 1 places the flux ejection tool 2 at a predetermined position of the placement member. The robot 1 couples the wrist 15 to the support tool 3. The position of the support tool 3 in the placement member 28 is predetermined. Thus, the robot 1 changes its position and posture based on the operation program 41 so as to be coupled to the support tool 3.

Figure 21:
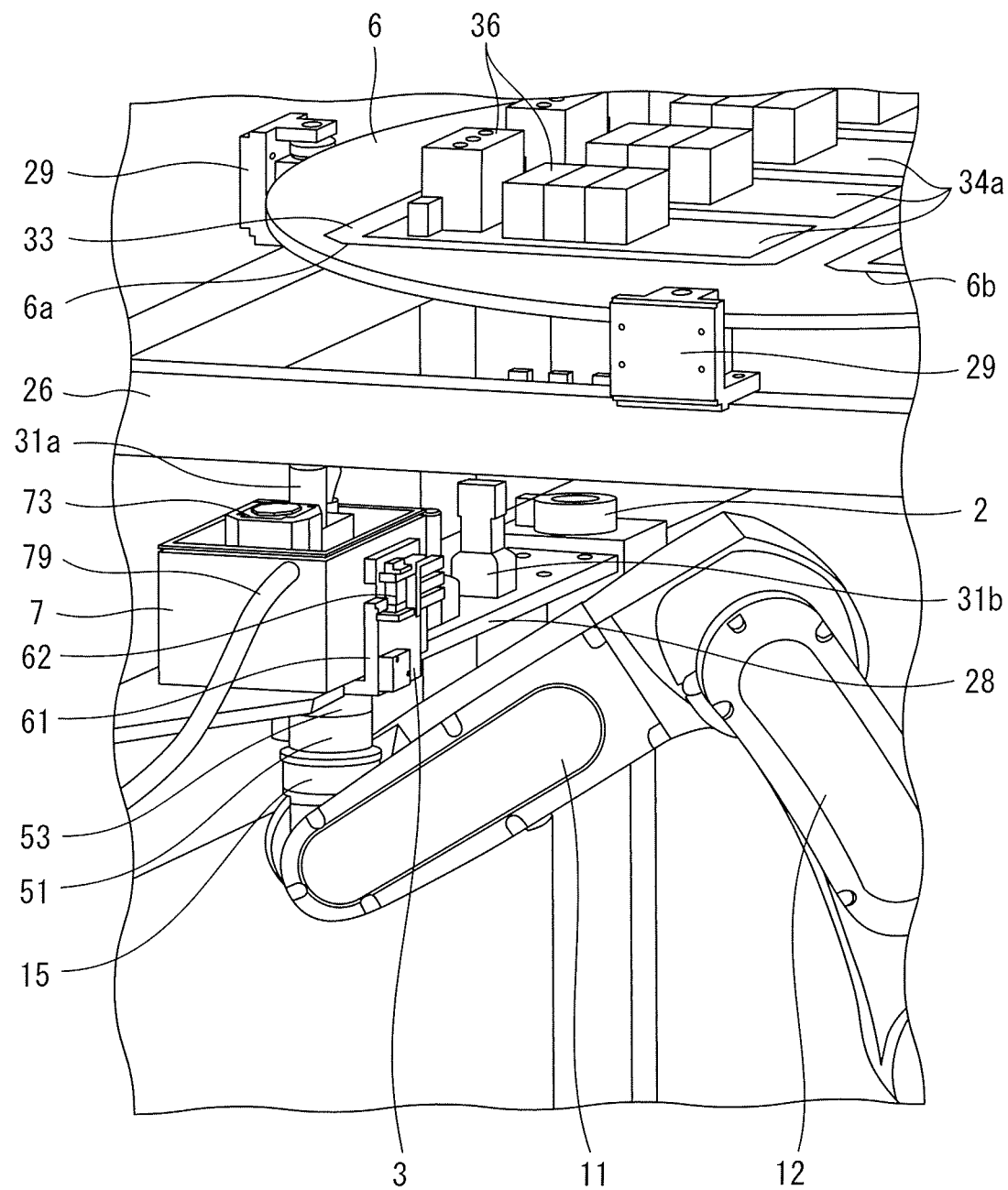
FIG. 21 is an enlarged perspective view of the robot apparatus for explaining a seventh process of soldering.

FIG. 21 is an enlarged perspective view of the solder pot and the robot for explaining the seventh process of soldering. The robot 1 changes its position and posture and thereby couples the base member 61 of the support tool 3 to the bottom surface of the solder pot V. The robot 1 supports the solder pot 7 via the support tool 3. The position of the solder pot 7 on the placement member 28 is predetermined. Thus, the robot 1 changes its position and posture based on the operation program 41 and thereby supports the solder pot 7 with the support tool 3.

Figure 22:
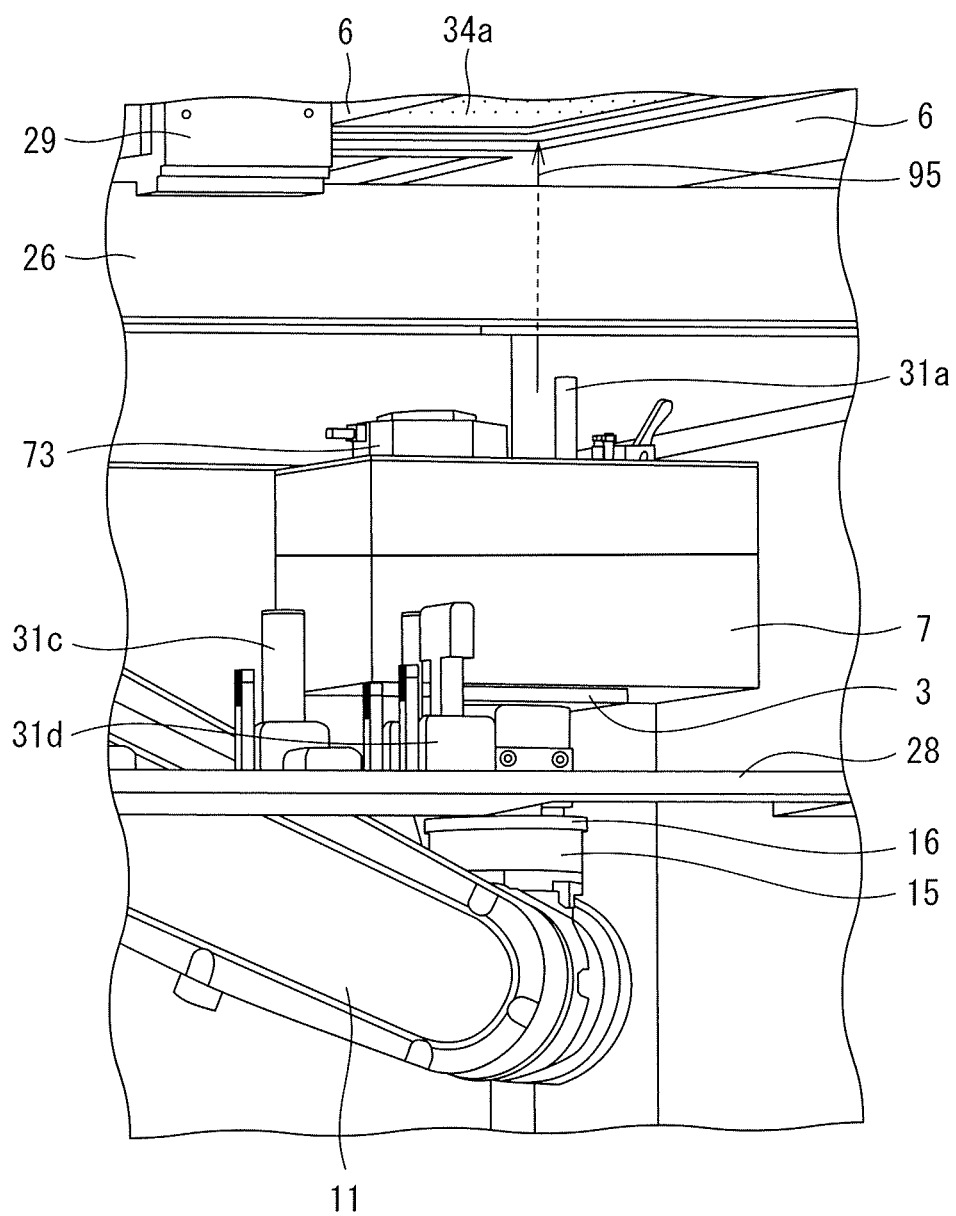
FIG. 22 is an enlarged perspective view of the robot apparatus for explaining an eighth process of soldering.

FIG. 22 is an enlarged perspective view of the robot apparatus for explaining the eighth process of soldering. The robot controller 4 performs a preheating control for heating the printed board 34*a* by heat released from the solder pot 7. The robot controller 4 controls the robot 1 so that the solder pot 7 is moved closer to a portion to be soldered of each printed board 34*a*. The table 6 is disposed so as to have a predetermined rotation angle. Thus, each printed board 34*a* is disposed at a predetermined position. The robot 1 changes its posture based on the operation program 41 so as to move the solder pot 7 to a predetermined position with respect to the printed board 34*a*. The solder pot 7 is spaced from the printed board 34*a* by a predetermined distance. In the present embodiment, the area surrounded by the wall part 72*a* of the solder pot 7 is disposed directly below a portion to be soldered.

In the solder pot 7 of the present embodiment, an opening is formed between the wall part 72*a* and the nozzle 31*a* (see FIG. 10). Molten solder is stored within the solder pot 7. The temperature of the solder is, for example, 200° C. or more and 300° C. or less. High-temperature air rises from the area surrounded by the wall part 72*a*, as indicated by arrow 95. The printed board 34*a* can be heated by the high-temperature air which is brought into contact with the back surface of the printed board 34*a*. For example, the printed board 34*a* can be preheated by disposing the solder pot 7 near the printed board 34*a* in a predetermined time length.

Thus, the area surrounded by the wall part 72*a* is disposed below a portion to be soldered, and thus the portion to be soldered can be locally heated. When a plurality of portions are soldered in one printed board, the robot controller 4 may perform the preheating control for the plurality of portions. Further, the robot controller 4 performs the preheating control for all the printed boards 34*a* disposed in the first area.

In the preheating control of the present embodiment, a preheating operation before the solder is applied can be performed by using heat released from the solder pot 7. Thus, it is not necessary to provide a device for heating a portion to be soldered, and the robot apparatus can be reduced in size.

Figure 23:
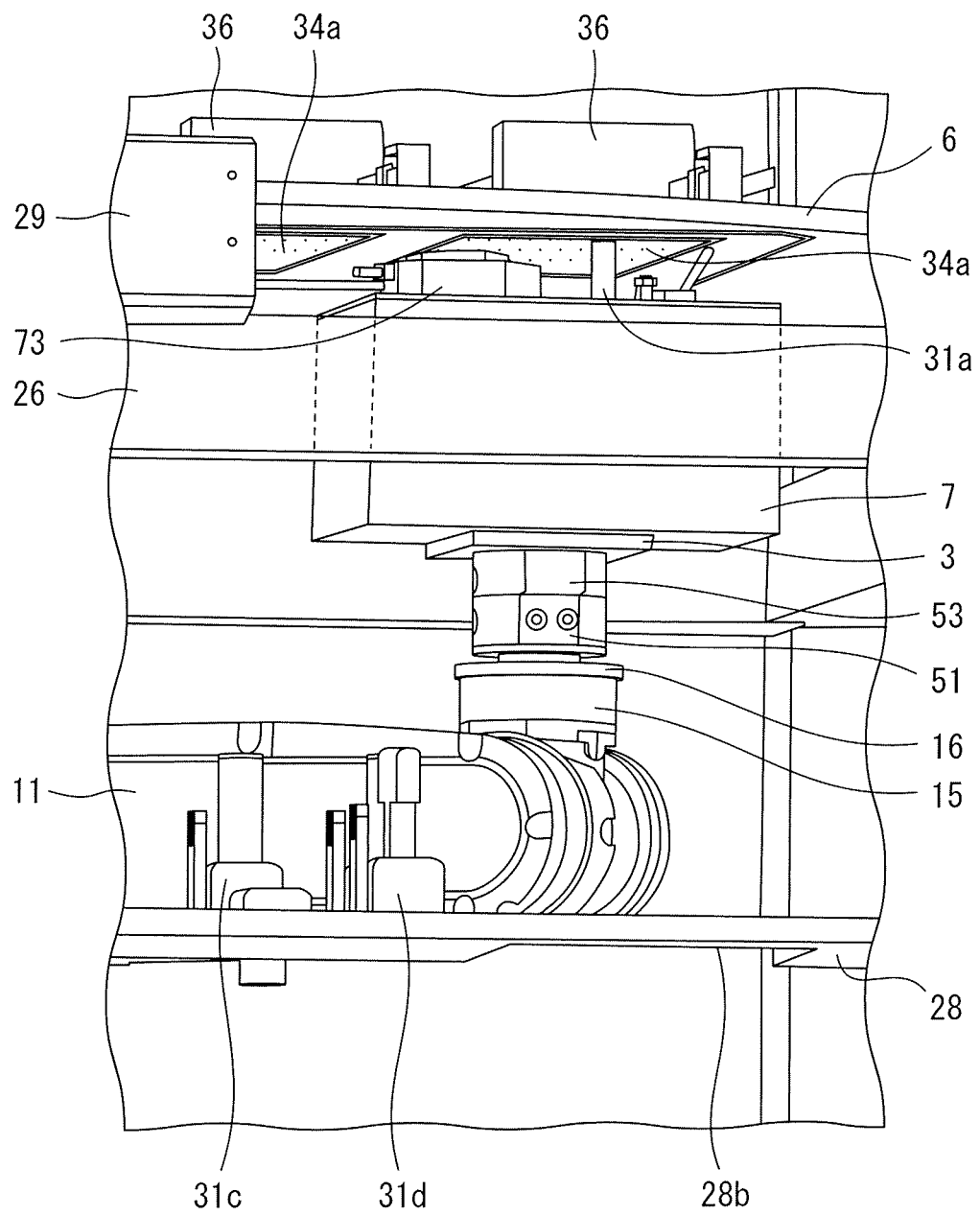
FIG. 23 is an enlarged perspective view of the robot apparatus for explaining a ninth process of soldering.

FIG. 23 is an enlarged perspective view of the robot apparatus for explaining the ninth process of soldering. After the preheating of a printed board 34*a* is completed, the robot controller 4 performs a supply control for moving the nozzle 31*a* closer to the printed board 34*a* so as to supply solder to a portion to be soldered. Based on the operation program 41, the robot controller 4 causes the robot 1 to change its position and posture and thereby causes the opening at the tip of the nozzle 31*a* to face the portion to be soldered. The nozzle 31*a* is arranged so as to be away from the printed board 34*a* by a predetermined distance. In the present embodiment, the solder pot 7 is disposed at a position closer to the printed board 34*a* than the position in the preheating control.

Subsequently, the motor 73 of the solder pot 7 is driven and thereby the solder flows out from the tip of the nozzle 31*a*. The solder flowed out from the tip of the nozzle 31*a* comes into contact with the printed board 34*a*, and thus the solder can be applied to the printed board 34*a*. The electronic components 36 are secured to the printed board 34*a* and connected to an electric circuit of the printed board.

The robot controller 4 performs a supply control for supplying solder to all the printed boards 34*a* disposed in the first area. Further, when a plurality of portions in one printed board are soldered, the solder may be supplied to a plurality of portions in one printed board.

After the supply of the solder is completed, the robot controller 4 controls the robot 1 so that the solder pot 7 is disposed at a predetermined position in the placement member 28. A notch 28*b* is formed in the placement member 28. The robot controller 4 can control the robot 1 so that the tool-side plate 53 is disposed inside the notch 28*b*.

Subsequently, the robot apparatus 5 starts a soldering operation for the printed boards 34*b* arranged in the second area on the rear side (see FIG. 20). A flux application control for applying flux to the printed boards 34*b* arranged in the opening 6*b* is performed. While the robot apparatus 5 applies the flux to the printed boards 34*b* arranged in the opening 6*b* in the second area, the printed boards 34*a* arranged in the opening 6*a* in the first area are discharged. The printed boards 34*a* can be discharged by a robot for discharging the printed boards 34*a*. Alternatively, the operator may discharge the printed boards 34*a*. Further, new printed boards 34*a* can be disposed in the opening 6*a*.

In the robot apparatus 5 of the present embodiment, while flux is applied to the printed boards in the area on the rear side, the printed boards arranged in the area on the front side are discharged. Further, new printed boards can be arranged in the area on the front side. Thus, the table 6 has a plurality of areas in which workpieces are arranged. The robot controller 4 continuously performs a flux application control, a preheating control, and a supply control for the areas one by one. By performing these controls, while the flux is applied to the printed boards arranged in one area, the printed boards that have been soldered can be discharged or new printed boards can be introduced. As a result, the soldering operation time can be shortened.

It should be noted that the table of the present embodiment is divided into two areas, but is not limited to this configuration. The table may be divided into three or more areas. Even in this case, the flux application control, the preheating control, and the supply control can be continuously performed for each area.

In the robot apparatus 5 in the present embodiment, one robot apparatus can continuously perform operations, i.e., from a flux applying operation to a solder supplying operation. A conveying device, such as a conveyor for conveying printed boards between a flux applying device, a preheating device, and a solder supplying device, is not necessary. In the robot apparatus 5 of the present embodiment, the robot 1 applies flux by using an operation tool. Further, the robot moves the solder pot 7 so as to preheat the printed boards 34a and 34b and supply solder to the printed boards. The robot apparatus 5 for soldering of the present embodiment is small and can automatically perform soldering.

Furthermore, the robot apparatus 5 according to the present embodiment can automatically replace the nozzle 31a of the solder pot 7 with another nozzle. Referring to FIG. 5, a plurality of types of nozzles 31b, 31c and 31d are placed on the placement member 28 of the present embodiment. The robot apparatus 5 of the present embodiment can replace the nozzle 31a disposed in the solder pot 7 with any of the nozzles 31b, 31c and 31d.

Figure 24:
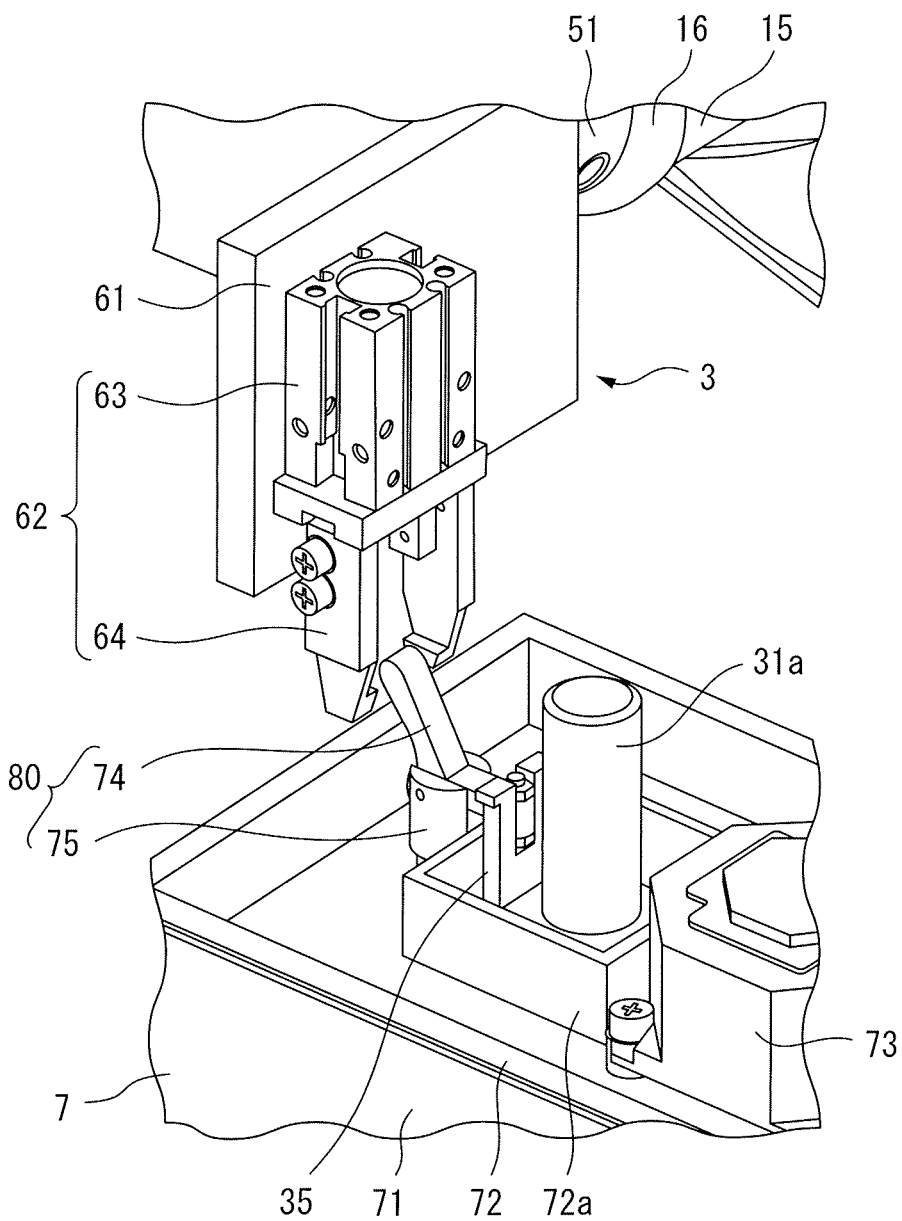
FIG. 24 is an enlarged perspective view of the solder pot and the support tool for explaining a first process in an operation of replacing a nozzle of the solder pot according to the embodiment.

FIG. 24 is an enlarged perspective view of the support tool and the solder pot for explaining the first process of nozzle replacement of the present embodiment. The robot controller 4 causes the wrist 15 of the robot 1 to be coupled to the support tool 3. The robot controller 4 causes the robot 1 to change its position and posture and thereby causes the chuck part 62 of the support tool 3 to be disposed so as to face the turning member 74 of the solder pot 7.

Figure 25:
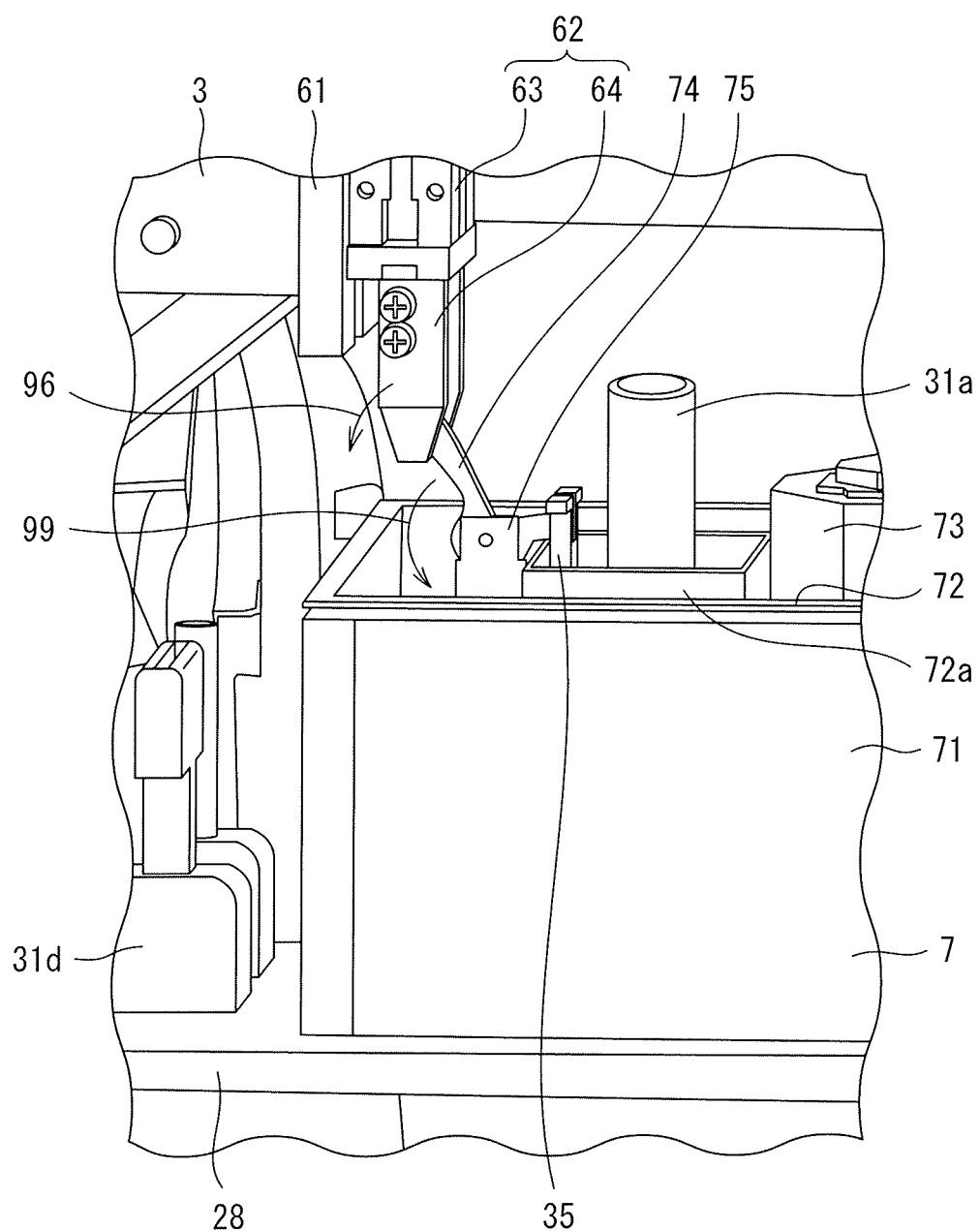
FIG. 25 is an enlarged perspective view of the solder pot and the support tool for explaining a second process in the operation of replacing the nozzle of the solder pot.

FIG. 25 is an enlarged perspective view of the support tool and the solder pot for explaining the second process of replacing the nozzle of the solder pot. The robot controller 4 controls the robot 1 and the support tool 3 so that the claws 64 grasp the tip of the turning member 74 of the solder pot 7. The robot controller 4 causes the chuck part 62 to move downward as indicated by arrow 96 after the claws 64 grasp the tip of the turning member 74. As indicated by arrow 99, the turning member 74 rotates about the axis as a rotation center supported by the support member 75.

Figure 26:
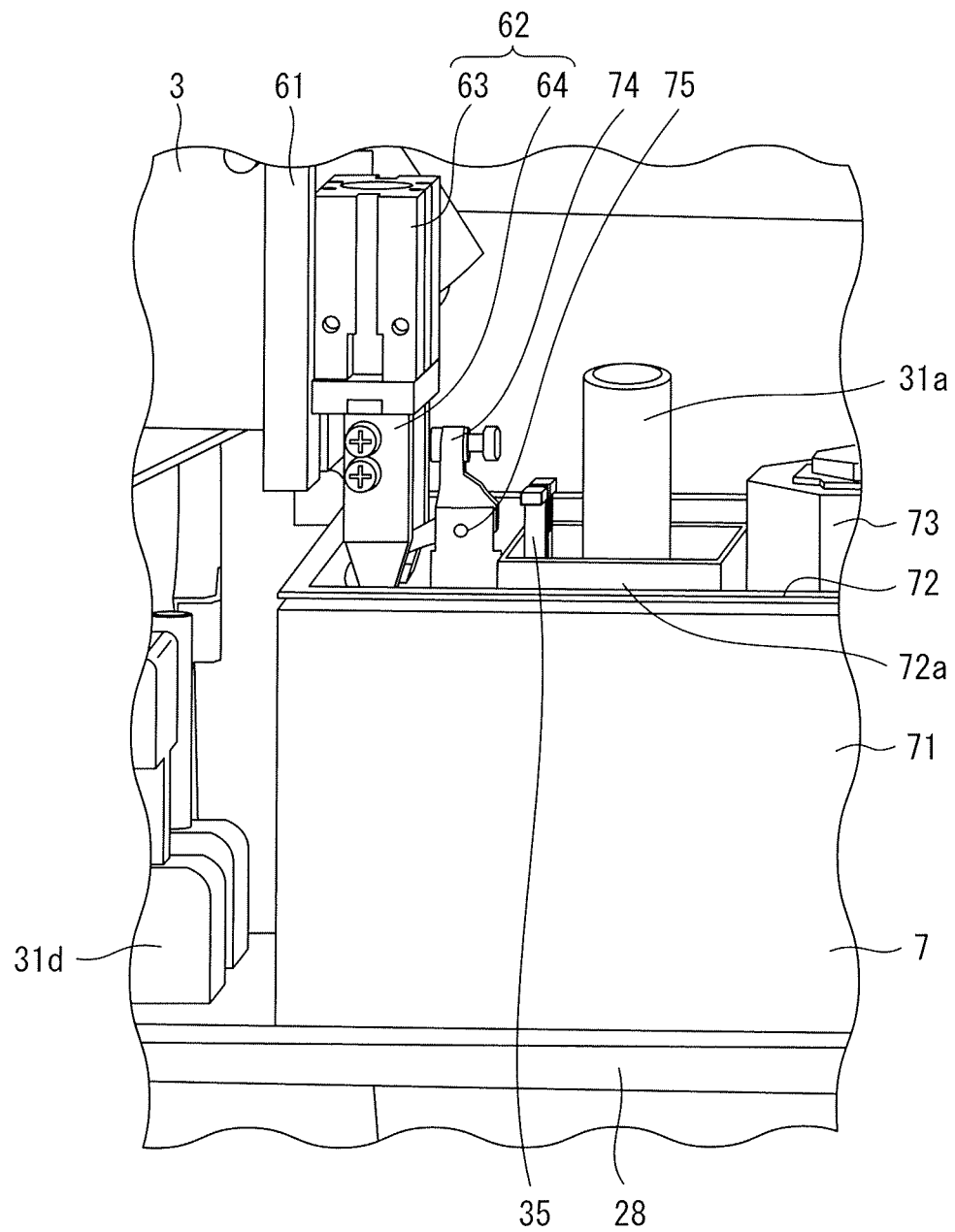
FIG. 26 is an enlarged perspective view of the solder pot and the support tool for explaining a third process in the operation of replacing the nozzle of the solder pot.

FIG. 26 is an enlarged perspective view of the support tool and the solder pot for explaining the third process of replacing the nozzle of the solder pot. As the turning member 74 is turned, the turning member 74 moves away from the engagement part 35 of the nozzle 31a. In this way, the securing of the nozzle 31a is released.

Figure 27:
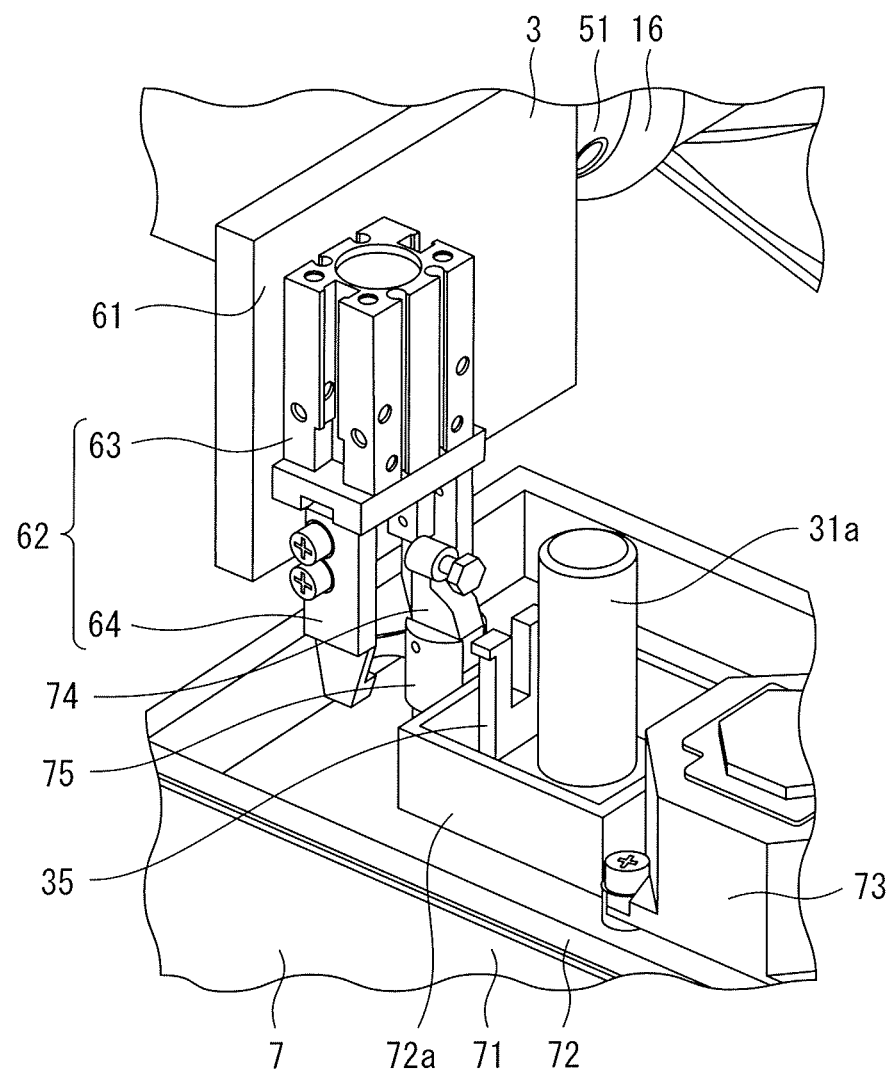
FIG. 27 is an enlarged perspective view of the solder pot and the support tool for explaining a fourth process in the operation of replacing the nozzle of the solder pot.

FIG. 27 is an enlarged perspective view of the support tool and the solder pot for explaining the fourth process of replacing the nozzle of the solder pot. After the turning member 74 is separated from the engagement part 35 of the nozzle 31a, the chuck part 62 releases the turning member 74.

Figure 28:
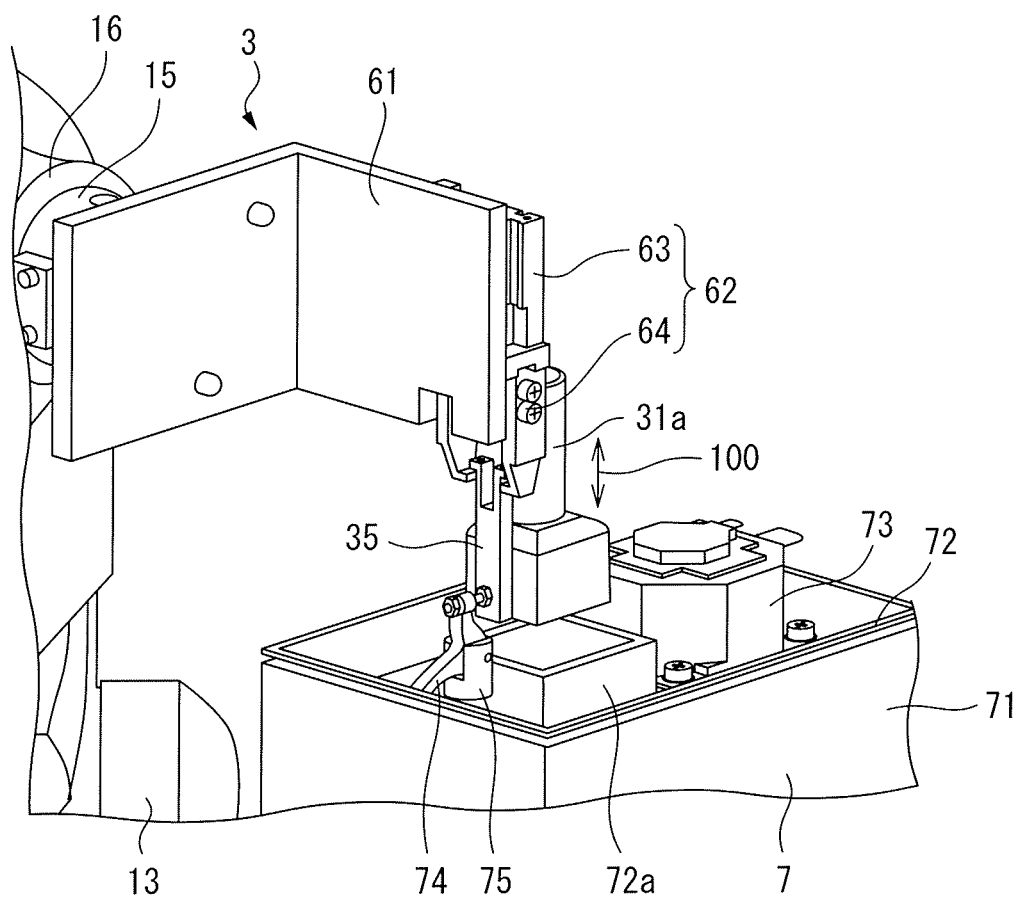
FIG. 28 is an enlarged perspective view of the solder pot and the support tool for explaining a fifth process in the operation of replacing the nozzle of the solder pot.

FIG. 28 is an enlarged perspective view of the support tool and the solder pot for explaining the fifth process of replacing the nozzle of the solder pot. Subsequently, the robot controller 4 controls the robot 1 and the chuck part 62 so that the claws 64 of the chuck part 62 grasp the engagement part 35 of the nozzle 31a. Further, after the chuck part 62 grasps the engagement part 35, the robot controller 4 causes the robot 1 to change its position and posture so as to pull out the nozzle 31a from the container 71 of the solder pot 7.

The robot controller 4 performs a control in which the nozzle 31a reciprocates in a predetermined direction immediately after the nozzle 31a is removed from the solder pot 7. In the present embodiment, the robot 1 stops when the nozzle 31a is slightly away from the solder pot 7. Subsequently, the robot 1 performs a control in which the nozzle 31a reciprocates in the vertical direction as indicated by arrow 100. By performing this control, the molten solder that adheres to the nozzle 31a can be dropped. The dropped solder returns to the inside of the container 71 through the space within the wall part 72a.

Alternatively, the robot 1 may reciprocate the nozzle 31a in the horizontal direction. Furthermore, the robot 1 may move the nozzle 31a in the horizontal direction and may cause the nozzle 31a to collide with the inner surface of the wall part 72a. These controls also cause the molten solder that adheres to the nozzle 31a to be dropped. Thus, the solder that adheres to the nozzle 31a can be returned to the inside of the container 71.

Subsequently, the robot controller 4 causes the robot 1 to change its position and posture and thereby causes the removed nozzle 31a to be placed at a predetermined position of the placement member 28. After the robot 1 changes its position and posture, the chuck part 62 of the support tool 3 releases the nozzle 31a, and thus the nozzle 31a can be placed on the placement member 28.

Subsequently, the robot controller 4 performs a control for arranging a nozzle different from the nozzle 31a in the solder pot 7. The robot controller 4 can perform controls in reverse procedure to the control for removing the nozzle 31a from the solder pot 7, and thus a new nozzle is attached to the solder pot 7. In other words, the chuck part 62 of the support tool 3 grasps the engagement part 35 of one of the nozzles 31b, 31c and 31d. Further, the robot 1 changes its position and posture and thereby inserts the nozzle into the space surrounded by the wall part 72a of the solder pot 7. The nozzle fits into the fitting member 76 of the solder pot (see FIG. 12). Thereafter, the chuck part 62 releases the nozzle.

Subsequently, the robot 1 changes its position and posture and thereby causes the chuck part 62 of the support tool 3 to grasp the tip of the turning member 74 of the solder pot 7. Further, the robot 1 changes its position and posture so as to turn the turning member 74. The turning member 74 is turned and thereby the tip of the turning member 74 is engaged with the engagement part 35 of the nozzle. The nozzle is secured to the solder pot 7.

In this way, the chuck part 62 of the support tool 3 of the present embodiment can operate the securing mechanism 80 of the nozzles 31a, 31b, 31c and 31d. The solder pot 7 is formed so that a plurality of types of nozzles 31a, 31b, 31c and 31d can be attached thereto. The robot controller 4 performs a control for operating the securing mechanism 80 by the chuck part 62. The robot controller 4 performs a control for grasping the nozzle by the chuck part 62. The robot controller 4 performs a replacement control for replacing the nozzle disposed in the solder pot 7 with a nozzle placed on the placement member 28. The replacement control for nozzles can be performed based on the operation program 41.

It is preferable that the shape of the tip of the nozzle of the solder pot and the size of the opening at the tip correspond to the shape and size of a portion to be soldered. For example, when the portion to be soldered is small, it is preferable that the opening at the tip of the nozzle is small. Alternatively, not only components may be disposed on the upper side of the printed board, but also components may be disposed on the back side of the printed board. When the diameter of the tip of the nozzle is large, the nozzle may interfere with the components disposed on the back side of the printed board. In such a case, it is preferable to use a nozzle having a small tip diameter. Further, when a plurality of types of printed boards are soldered, it is preferable to replace the nozzle depending on the type of each printed board.

In the robot apparatus of the present embodiment, the nozzle of the solder pot can be automatically replaced depending on the size and shape of a portion to be soldered. Alternatively, when a plurality of portions in one type of printed board are soldered, the nozzle may be replaced with another nozzle during the period of soldering the one type of printed board in order to solder the plurality of portions.

Subsequently, the robot apparatus of the present embodiment can automatically perform a control for replenishing solder when the amount of solder stored in the solder pot decreases. The control for replenishing solder can be performed based on the operation program 41. Referring to FIG. 5, auxiliary solder bars 32 are placed on the placement member 28. The robot controller 4 performs a control for inserting the solder bar 32 into the solder pot 7 based on the operation program 41.

In the solder pot 7 of the present embodiment, a sensor for detecting the amount of solder stored in the solder pot is disposed. Any sensor that can detect the amount of solder, such as a water level sensor, can be used as the sensor. The robot controller 4 detects the amount of solder inside the solder pot 7. The robot controller 4 detects that the amount of solder is small. For example, the robot controller 4 detects the amount of solder that is less than a predetermined determination value.

Figure 29:
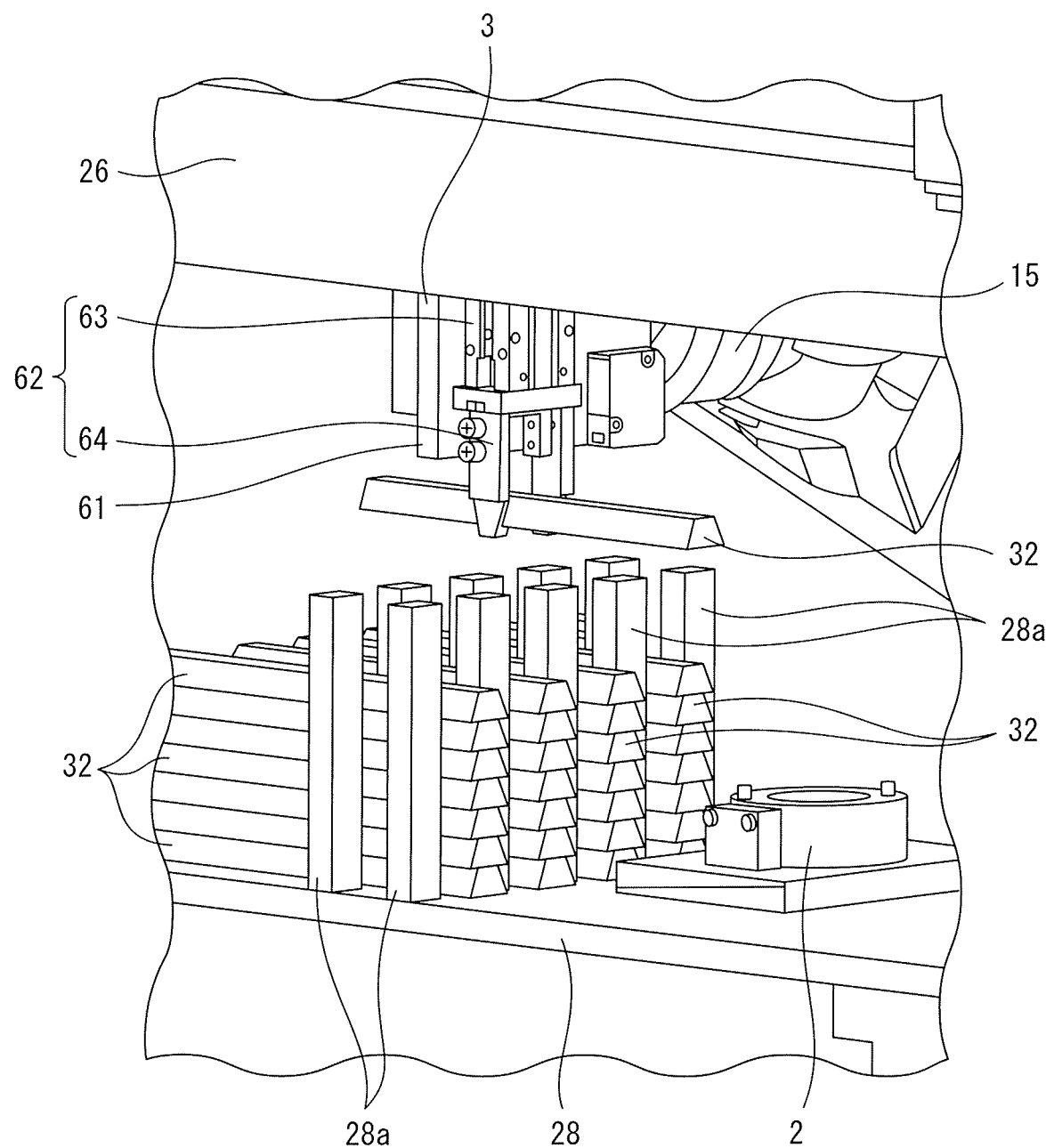
FIG. 29 is an enlarged perspective view of the support tool and solder bars for explaining a first process in an operation of replenishing the solder pot with solder.

FIG. 29 is an enlarged perspective view of the robot apparatus for explaining the first process of a control for replenishing the solder pot with solder. The robot controller 4 controls the robot 1 and the chuck part 62 so that a solder bar 32 is grasped by the chuck part 62 of the support tool 3. The chuck part 62 grasps one of the solder bars 32 placed on the placement member 28.

Figure 30:
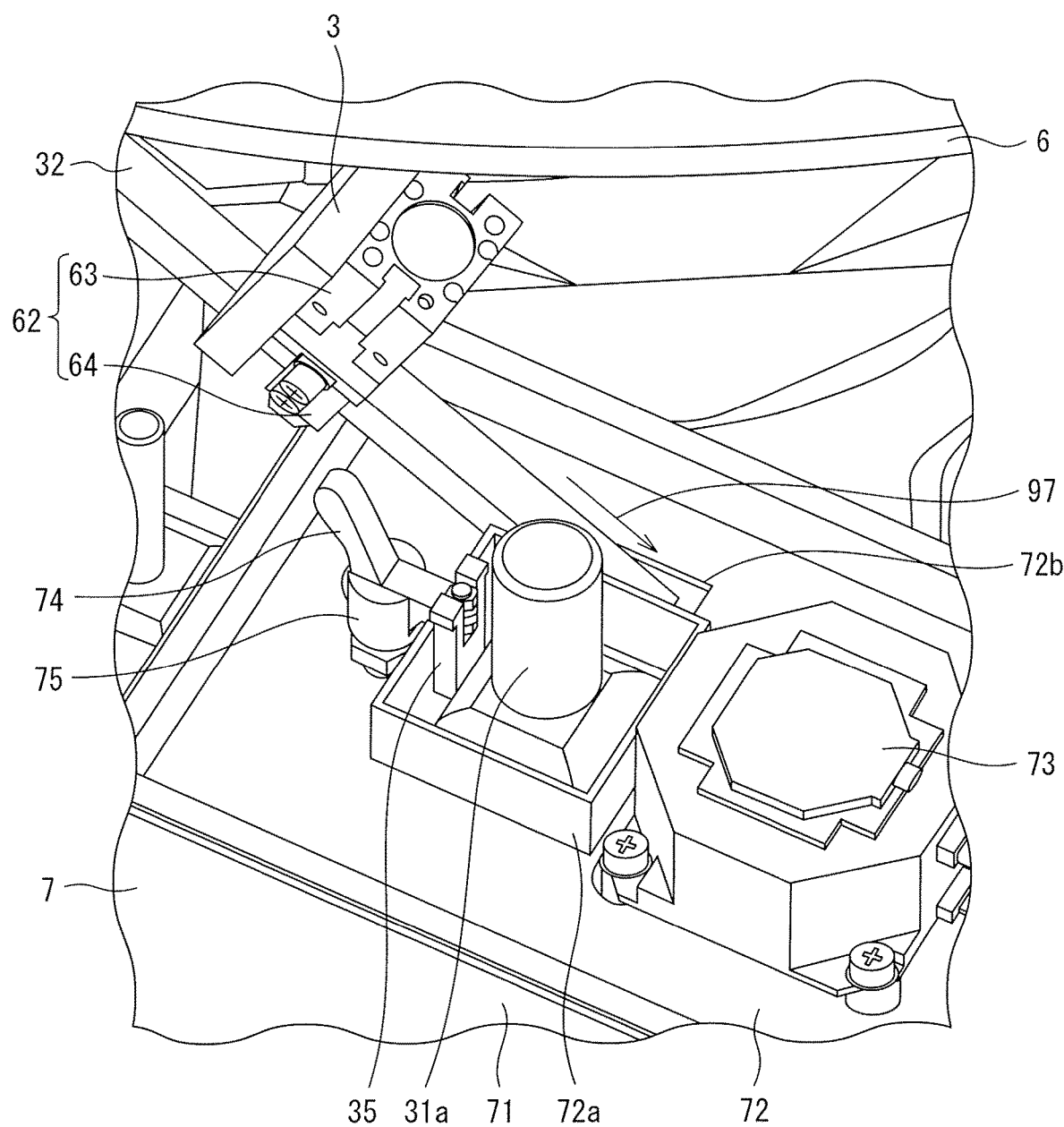
FIG. 30 is an enlarged perspective view of the solder pot and the solder bar grasped by the support tool for explaining a second process in the operation of replenishing the solder pot with solder.

FIG. 30 is an enlarged perspective view of the robot apparatus for explaining the second process of the control for replenishing the solder pot with solder. The robot controller 4 causes the robot 1 to change its position and posture and thereby causes the solder bar 32 to be inserted into a hole 72b as an insertion port formed in the lid member 72 of the solder pot 7 as indicated by arrow 97. The solder bar 32 is inserted into the solder pot 7 and then melted.

In this way, the robot 1 and the chuck part 62 of the support tool 3 are controlled so as to replenish the solder bar 32. In the robot apparatus 5 of the present embodiment, it is not necessary to arrange a device for supplying solder, and the configuration of the device for soldering can be simplified. It is also conceivable to arrange a device for supplying solder formed in a linear shape to the solder pot. However, when the solder formed in a linear shape is supplied, there is the problem that it takes a long time to supply the solder. By supplying the solder bar as in the present embodiment, the time required for supplying the solder can be shortened.

The support tool for supporting the solder pot in the present embodiment has a chuck part that can grasp a workpiece, but is not limited to this configuration. Apart from the support tool, an operation tool such as a hand tool for grasping the workpiece can be disposed. This operation tool can also be placed on the placement member. However, as in the present embodiment, the chuck part is disposed on the support tool, and thus the number of operation tools can be reduced, and the size of the robot apparatus can be reduced.

Figure 31:
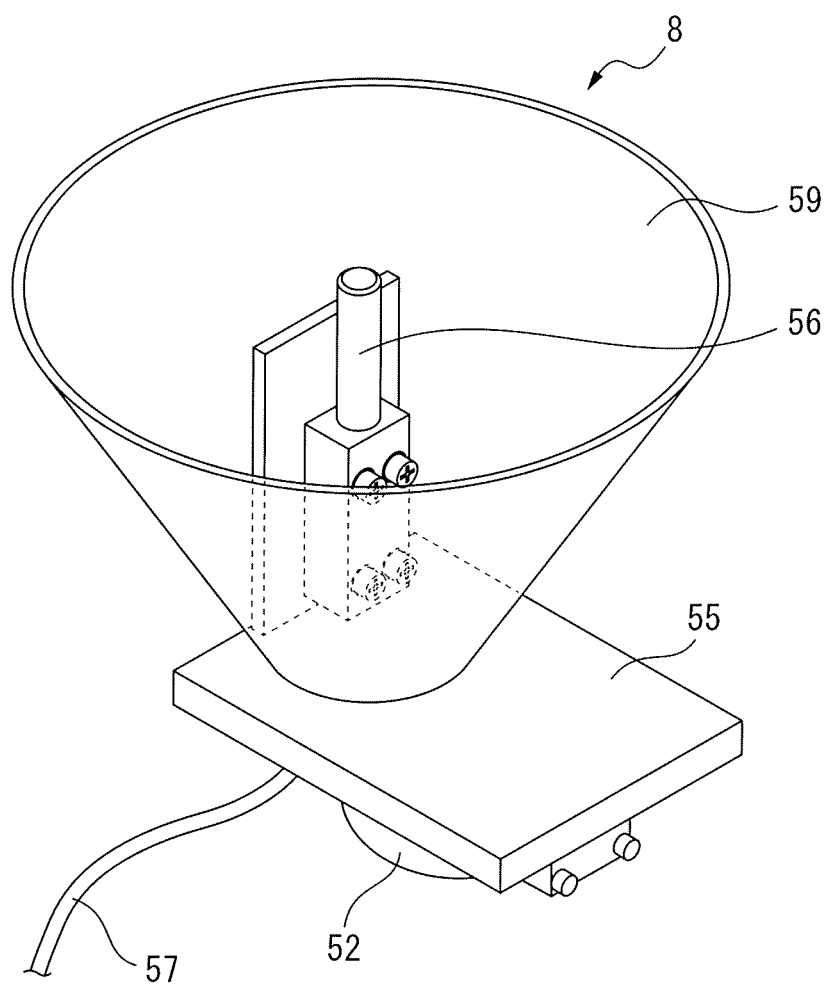
FIG. 31 is an enlarged perspective view of another flux ejection tool according to the embodiment.

FIG. 31 shows another flux ejection tool according to the present embodiment. Another flux ejection tool 8 of the present embodiment has a surrounding member 59 disposed around the nozzle 56. The surrounding member 59 is formed so as to surround the nozzle 56. Further, the surrounding member 59 in the present embodiment is formed into a conical shape. The surrounding member 59 is formed so that the inner diameter increases toward the tip of the nozzle 56.

When the flux is ejected from the tip of the nozzle 56, the flux may scatter and may contaminate members inside the robot apparatus 5. The surrounding member 59 is disposed in the flux ejection tool 8, and thus the flux can be suppressed from being scattered around. For example, it is possible to suppress the flux from adhering to the surface of the device disposed inside the frame body 26.

In the above embodiments, the workpiece is preheated with high-temperature air generated in the solder pot, but the embodiment is not limited to this. An operation tool for preheating the workpiece may be disposed separately from the solder pot.

Figure 32:
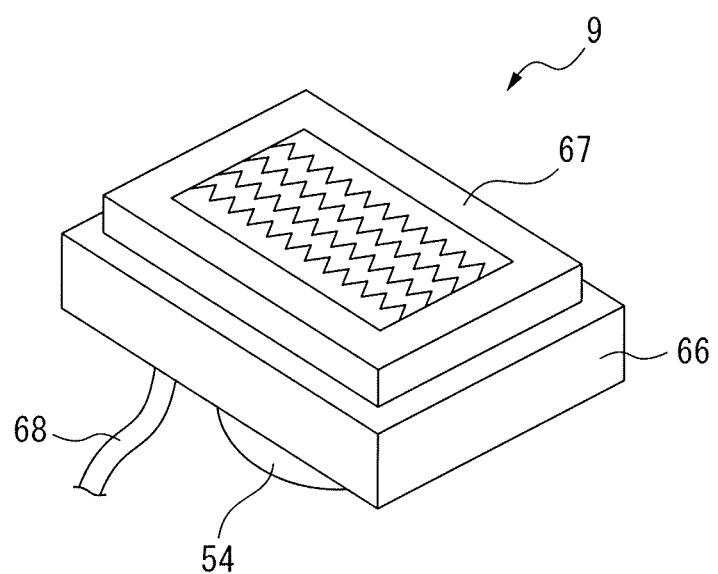
FIG. 32 is a perspective view of a preheating tool according to the embodiment.

FIG. 32 is a perspective view of a preheating tool of the present embodiment. The preheating tool 9 is an operation tool coupled to the wrist 15 of the robot 1. The preheating tool 9 includes a base member 66 and an electric heater 67 serving as a heater disposed on the surface of the base member 66. The temperature of the electric heater 67 increases when the electricity is supplied via a cable 68. The preheating tool 9 is coupled to the robot-side plate 51, which is secured to the wrist 15 of the robot 1, via the tool-side plate 54.

The preheating tool 9 can be placed on the placing member when not in use. For example, a notch corresponding to the electric heater 67 can be formed in the placement member. The preheating tool 9 can be placed on the placement member so that the electric heater 67 is disposed inside the notch.

When the robot apparatus includes the preheating tool 9, the flux application control can be performed in the same manner as the above-described control. In a preheating control, the robot controller 4 changes the operation tool coupled to the robot 1 from the flux ejection tool 2 to the preheating tool 9. The robot controller 4 causes the robot 1 to change its position and posture so as to move the preheating tool 9 closer to one printed board 34a, 34b. The robot 1 arranges the electric heater 67 so that the electric heater faces the printed board 34a, 34b. This control enables the printed board 34a, 34b to be heated. Thereafter, the robot controller 4 changes the operation tool coupled to the robot 1 to the support tool 3. The robot controller 4 can perform a supply control for supporting the solder pot 7 by the robot 1 and supplying solder to a portion to be soldered.

Even in the robot apparatus provided with the preheating tool of the present embodiment, it is not necessary to convey the printed board among a flux applying device, a substrate preheating device, and a solder supplying device. Thus, the size of the apparatus for soldering can be reduced.

In the present embodiment, the position and posture of the robot are controlled so as to be the position and posture which are predetermined in the operation program, but are not limited to this configuration. For example, a camera may be disposed on a wrist or a chuck part of the robot. The robot controller may detect a position of an object to be operated based on the image captured by the camera. For example, the robot controller may detect, for example, the position of the operation tool placed on the placement member, the position of the printed board, and the position of the turning member of the solder pot, based on the image captured by the camera.

The workpiece of the present embodiment is a printed board, but is not limited to this configuration. Any workpiece can be adopted as a workpiece to be soldered.

In the present embodiment, all operation tools and members necessary for soldering are arranged on the surface of one placement member, but are not limited to this configuration. The robot apparatus may include a plurality of placement members. For example, operation tools and members necessary for soldering may be separately placed on a plurality of placement members.

According to an aspect of this disclosure, it is possible to provide a small robot apparatus that can perform soldering.

In each of the above-described controls, the order of the steps can be appropriately changed within a range where the function and the action are not changed.

The above embodiments can be combined as appropriate. In the respective drawings described above, the same or equivalent parts are denoted by the same reference numerals. It should be noted that the above embodiments are for purposes of illustration and do not limit the invention. Further, in the embodiments, modifications of the embodiments shown in the claims are included.

The invention claimed is:

1. A robot apparatus for soldering, comprising:
   a frame body having arranged therein:
      a single robot having a plurality of joints;
      operation tools each of which is configured to be individually connected to the robot;
      a solder pot having a container for melting and storing solder and a nozzle from which the solder flows out;
      a table secured to the frame body of the robot apparatus and disposed above the single robot, wherein the table supports a workpiece;
      a placement member supported by the frame body of the robot apparatus, arranged below the table and upon which the operation tools and the solder pot are placed, wherein the placement member is formed to include support pillars configured to support at least one solder bar placed therebetween; and
      a controller for controlling the single robot,
   wherein
   the operation tools include a flux ejection tool for ejecting soldering flux, and a support tool for supporting the solder pot,
   the single robot has a function of automatically changing its position and posture to connect to and exchange the operation tools during a plurality of processes for the soldering to provide continuous performance of operations related to the soldering of the workpiece,
   the operation tools and the solder pot are placed on the placement member, and
   the controller performs a flux application control for coupling the flux ejection tool to the single robot and applying flux to a portion of the workpiece to be soldered, a preheating control for coupling the support tool to the single robot and arranging the solder pot below the workpiece so that the workpiece is heated by heat released from the solder pot, and a supply control for moving the nozzle of the solder pot closer to the workpiece and supplying the solder to the portion of the workpiece to be soldered.

2. The robot apparatus according to claim 1, comprising a table drive device for rotating the table, wherein
   the controller controls the table drive device,
   the table has a plurality of areas on which workpieces are placed, and
   the controller continuously performs the flux application control, the preheating control, and the supply control for each area.

3. The robot apparatus according to claim 1, wherein
   the solder pot has a securing mechanism for securing or releasing the nozzle of the solder pot, and is formed so that a plurality of types of nozzles can be attached,
   the placement member is formed so that the plurality of types of nozzles can be placed,
   the support tool has a chuck part for operating the securing mechanism, and
   the controller replaces the nozzle disposed in the solder pot with one of the plurality of types of nozzles placed on the placement member by performing a control for operating the securing mechanism by the chuck part and a control for grasping one of the plurality of types of nozzles by the chuck part.

4. The robot apparatus according to claim 3, wherein
   the controller performs a control in which the nozzle is reciprocated in a predetermined direction when the nozzle disposed in the solder pot is removed from the solder pot.

5. The robot apparatus according to claim 1, wherein
   the at least one solder bar replenishes the solder pot,
   the solder pot has an insertion port into which the at least one solder bar is inserted,
   the support tool has a chuck part for grasping the at least one solder bar, and
   the controller performs a control for grasping the at least one solder bar by the chuck part and inserting the at least one solder bar into the insertion port of the solder pot.

* * * * *